United States Patent
Spanier et al.

(10) Patent No.: US 9,482,555 B2
(45) Date of Patent: Nov. 1, 2016

(54) SYSTEM AND METHOD FOR IMPROVED DATA TRANSFER FROM AN IED

(75) Inventors: Joseph Spanier, Brooklyn, NY (US); Wei Wang, Mahwah, NJ (US); Rory A. Koval, Commack, NY (US); Andrew J. Werner, Wading River, NY (US)

(73) Assignee: ELECTRO INDUSTRIES/GAUGE TECH., Westbury, NY (US)

( * ) Notice: Subject to any disclaimer, the term of this patent is extended or adjusted under 35 U.S.C. 154(b) by 0 days.

(21) Appl. No.: 12/817,804

(22) Filed: Jun. 17, 2010

(65) Prior Publication Data

US 2011/0040809 A1    Feb. 17, 2011

Related U.S. Application Data

(63) Continuation-in-part of application No. 12/061,979, filed on Apr. 3, 2008.

(60) Provisional application No. 61/187,885, filed on Jun. 17, 2009.

(51) Int. Cl.
| | |
|---|---|
| *G06F 7/00* | (2006.01) |
| *G06F 17/30* | (2006.01) |
| *G01D 4/00* | (2006.01) |
| *G01R 22/10* | (2006.01) |

(52) U.S. Cl.
CPC ......... *G01D 4/004* (2013.01); *G06F 17/30067* (2013.01); *G06F 17/30864* (2013.01); *G01R 22/10* (2013.01); *Y02B 90/242* (2013.01); *Y04S 20/322* (2013.01)

(58) Field of Classification Search
CPC .................. G06F 17/30067; G06F 17/30864
See application file for complete search history.

(56) References Cited

U.S. PATENT DOCUMENTS

| | | | |
|---|---|---|---|
| 2,435,753 | A | 2/1948 | Richter et al. |
| 2,606,943 | A | 8/1952 | Barker |
| 2,883,255 | A | 4/1959 | Anderson |
| 2,987,704 | A | 6/1961 | Gimpel et al. |
| 3,142,820 | A | 7/1964 | Daniels |
| 3,453,540 | A | 7/1969 | Dusheck, Jr. |
| 3,824,441 | A | 7/1974 | Heyman et al. |
| 4,246,623 | A | 1/1981 | Sun |
| 4,466,071 | A | 8/1984 | Russell, Jr. |
| 4,884,021 | A | 11/1989 | Hammond et al. |
| 4,996,646 | A | 2/1991 | Farrington |
| 5,014,229 | A | 5/1991 | Mofachern |
| 5,166,887 | A | 11/1992 | Farrington et al. |
| 5,170,360 | A | 12/1992 | Porter et al. |
| 5,185,705 | A | 2/1993 | Farrington |
| 5,212,441 | A | 5/1993 | McEachern et al. |
| 5,224,054 | A | 6/1993 | Wallis |

(Continued)

OTHER PUBLICATIONS

7700 Ion 3-Phase Power Meter, Analyzer and Controller, pp. 1-8, Nov. 30, 2000.

(Continued)

*Primary Examiner* — Loan T Nguyen
(74) *Attorney, Agent, or Firm* — Gerald E. Hespos; Michael J. Porco; Matthew T. Hespos

(57) ABSTRACT

A system and method for providing easy access to an internal file structure of an intelligent electronic device (IED), e.g., a power meter, not presently defined or supported directly by legacy protocols used in metering industry, such as the Modbus protocol.

24 Claims, 14 Drawing Sheets

(56) References Cited

U.S. PATENT DOCUMENTS

| | | |
|---|---|---|
| 5,233,538 A | 8/1993 | Wallis |
| 5,237,511 A | 8/1993 | Caird et al. |
| 5,298,854 A | 3/1994 | McEachern et al. |
| 5,298,855 A | 3/1994 | McEachern et al. |
| 5,298,856 A | 3/1994 | McEachern et al. |
| 5,298,859 A | 3/1994 | McEachern et al. |
| 5,298,885 A | 3/1994 | McEachern et al. |
| 5,298,888 A | 3/1994 | McEachern et al. |
| 5,300,924 A | 4/1994 | McEachern et al. |
| 5,302,890 A | 4/1994 | McEachern et al. |
| 5,307,009 A | 4/1994 | McEachern et al. |
| 5,315,527 A | 5/1994 | Beckwith |
| 5,347,464 A | 9/1994 | McEachern et al. |
| 5,544,064 A | 8/1996 | Beckwith |
| 5,559,719 A | 9/1996 | Johnson et al. |
| 5,574,654 A | 11/1996 | Bingham et al. |
| 5,581,173 A | 12/1996 | Yalla et al. |
| 5,706,204 A | 1/1998 | Cox et al. |
| 5,764,523 A | 6/1998 | Yoshinaga et al. |
| 5,774,366 A | 6/1998 | Beckwith |
| 5,801,643 A | 9/1998 | Williams et al. |
| 5,819,203 A | 10/1998 | Moore et al. |
| 5,822,165 A | 10/1998 | Moran |
| 5,832,210 A | 11/1998 | Akiyama et al. |
| 5,874,903 A | 2/1999 | Shuey et al. |
| 5,898,387 A | 4/1999 | Davis et al. |
| 5,899,960 A | 5/1999 | Moore et al. |
| 5,986,574 A | 11/1999 | Colton |
| 6,018,690 A | 1/2000 | Saito et al. |
| 6,038,516 A | 3/2000 | Alexander et al. |
| 6,073,169 A | 6/2000 | Shuey et al. |
| 6,098,175 A | 8/2000 | Lee |
| 6,100,817 A | 8/2000 | Mason |
| 6,157,329 A | 12/2000 | Lee et al. |
| 6,167,329 A | 12/2000 | Engel et al. |
| 6,195,614 B1 | 2/2001 | Kochan |
| 6,289,267 B1 | 9/2001 | Alexander et al. |
| 6,396,839 B1 | 5/2002 | Ardalan et al. |
| 6,418,450 B2* | 7/2002 | Daudenarde ................ 707/602 |
| 6,437,692 B1 | 8/2002 | Petite et al. |
| 6,493,644 B1 | 12/2002 | Jonker et al. |
| 6,519,537 B1 | 2/2003 | Yang |
| 6,528,957 B1 | 3/2003 | Luchaco |
| 6,615,147 B1 | 9/2003 | Jonker et al. |
| 6,636,030 B1 | 10/2003 | Rose et al. |
| 6,657,552 B2 | 12/2003 | Belski et al. |
| 6,671,654 B1 | 12/2003 | Forth et al. |
| 6,671,802 B1 | 12/2003 | Ott |
| 6,717,394 B2 | 4/2004 | Elms |
| 6,735,535 B1 | 5/2004 | Kagan et al. |
| 6,751,563 B2 | 6/2004 | Spanier et al. |
| 6,792,364 B2 | 9/2004 | Jonker et al. |
| 6,836,737 B2 | 12/2004 | Petite et al. |
| 6,842,707 B2 | 1/2005 | Raichle et al. |
| 6,900,738 B2 | 5/2005 | Crichlow |
| 6,944,555 B2* | 9/2005 | Blackett et al. ............. 702/62 |
| 6,957,158 B1 | 10/2005 | Hancock et al. |
| 6,961,641 B1* | 11/2005 | Forth et al. .................. 700/295 |
| 6,985,087 B2 | 1/2006 | Soliman |
| 7,006,934 B2 | 2/2006 | Jonker et al. |
| 7,010,438 B2 | 3/2006 | Hancock et al. |
| 7,043,459 B2 | 5/2006 | Peevey |
| 7,049,975 B2 | 5/2006 | Vanderah et al. |
| 7,050,808 B2 | 5/2006 | Janusz et al. |
| 7,072,779 B2 | 7/2006 | Hancock et al. |
| 7,085,824 B2 | 8/2006 | Forth et al. |
| 7,126,493 B2 | 10/2006 | Junker et al. |
| 7,243,050 B2 | 7/2007 | Armstrong |
| 7,304,586 B2 | 12/2007 | Wang et al. |
| 7,337,081 B1 | 2/2008 | Kagan et al. |
| 7,342,507 B2 | 3/2008 | Jonker et al. |
| 7,436,687 B2 | 10/2008 | Patel |
| 7,444,454 B2 | 10/2008 | Yancey et al. |
| 7,511,468 B2 | 3/2009 | McEachern et al. |
| 7,514,907 B2 | 4/2009 | Rajda et al. |
| 7,616,656 B2 | 11/2009 | Wang et al. |
| 7,761,910 B2* | 7/2010 | Ransom et al. ............. 700/295 |
| 7,765,127 B2* | 7/2010 | Banks et al. ................. 705/26.8 |
| 7,899,630 B2 | 3/2011 | Kagan |
| 7,916,060 B2 | 3/2011 | Zhu et al. |
| 7,962,298 B2 | 6/2011 | Przydatek et al. |
| 7,999,696 B2 | 8/2011 | Wang et al. |
| 8,078,418 B2 | 12/2011 | Banhegyesi et al. |
| 8,160,824 B2 | 4/2012 | Spanier et al. |
| 8,190,381 B2 | 5/2012 | Spanier et al. |
| 8,599,036 B2 | 12/2013 | Wang et al. |
| 2002/0032535 A1 | 3/2002 | Alexander et al. |
| 2002/0105435 A1 | 8/2002 | Yee et al. |
| 2002/0120723 A1 | 8/2002 | Forth et al. |
| 2002/0129342 A1 | 9/2002 | Kil et al. |
| 2002/0169570 A1 | 11/2002 | Spanier et al. |
| 2003/0014200 A1 | 1/2003 | Jonker et al. |
| 2003/0093429 A1 | 5/2003 | Nishikawa et al. |
| 2003/0154471 A1* | 8/2003 | Teachman ............. G06F 9/4401 717/171 |
| 2003/0178982 A1 | 9/2003 | Elms |
| 2003/0187550 A1 | 10/2003 | Wilson et al. |
| 2003/0226058 A1 | 12/2003 | Miller et al. |
| 2004/0128260 A1 | 7/2004 | Amedure et al. |
| 2004/0138786 A1* | 7/2004 | Blackett .................. G01D 4/00 700/295 |
| 2004/0172207 A1 | 9/2004 | Hancock et al. |
| 2004/0177062 A1 | 9/2004 | Urquhart et al. |
| 2004/0193329 A1 | 9/2004 | Ransom et al. |
| 2004/0208182 A1 | 10/2004 | Boles et al. |
| 2005/0027464 A1 | 2/2005 | Jonker et al. |
| 2005/0060110 A1 | 3/2005 | Jones et al. |
| 2005/0093571 A1 | 5/2005 | Suaris et al. |
| 2005/0144437 A1* | 6/2005 | Ransom et al. ............. 713/151 |
| 2005/0187725 A1 | 8/2005 | Cox |
| 2005/0273280 A1 | 12/2005 | Cox |
| 2006/0047787 A1 | 3/2006 | Agarwal et al. |
| 2006/0052958 A1 | 3/2006 | Hancock et al. |
| 2006/0066456 A1 | 3/2006 | Jonker et al. |
| 2006/0066903 A1 | 3/2006 | Shiimori |
| 2006/0083260 A1 | 4/2006 | Wang et al. |
| 2006/0085419 A1 | 4/2006 | Rosen |
| 2006/0145890 A1 | 7/2006 | Junker et al. |
| 2006/0161360 A1 | 7/2006 | Yao et al. |
| 2006/0200599 A1 | 9/2006 | Manchester et al. |
| 2006/0267560 A1 | 11/2006 | Rajda et al. |
| 2007/0058634 A1 | 3/2007 | Gupta et al. |
| 2007/0067119 A1 | 3/2007 | Loewen et al. |
| 2007/0067121 A1 | 3/2007 | Przydatek et al. |
| 2007/0096765 A1 | 5/2007 | Kagan et al. |
| 2007/0096942 A1 | 5/2007 | Kagan et al. |
| 2007/0112446 A1* | 5/2007 | Deveaux .................. G06F 8/60 700/83 |
| 2007/0152058 A1 | 7/2007 | Yeakley et al. |
| 2008/0086222 A1 | 4/2008 | Kagan et al. |
| 2008/0091770 A1* | 4/2008 | Petras ..................... G06F 15/16 709/203 |
| 2008/0147334 A1 | 6/2008 | Kagan et al. |
| 2008/0172192 A1 | 7/2008 | Banhegyesi |
| 2008/0195794 A1 | 8/2008 | Banker |
| 2008/0215264 A1 | 9/2008 | Spanier et al. |
| 2008/0234957 A1 | 9/2008 | Banhegyesi et al. |
| 2008/0235355 A1* | 9/2008 | Spanier et al. ............. 709/219 |
| 2008/0238406 A1 | 10/2008 | Banhegyesi |
| 2008/0238713 A1 | 10/2008 | Banhegyesi et al. |
| 2009/0012728 A1 | 1/2009 | Spanier et al. |
| 2009/0096654 A1 | 4/2009 | Zhu et al. |
| 2009/0228224 A1 | 9/2009 | Spanier et al. |
| 2010/0054276 A1 | 3/2010 | Wang et al. |
| 2010/0153036 A1* | 6/2010 | Elwarry et al. .............. 702/62 |
| 2010/0169876 A1* | 7/2010 | Mann ......................... 717/170 |
| 2010/0324845 A1 | 12/2010 | Spanier et al. |
| 2011/0040809 A1 | 2/2011 | Spanier et al. |
| 2011/0153697 A1* | 6/2011 | Nickolov ............... G06F 9/4856 707/827 |

(56) References Cited

U.S. PATENT DOCUMENTS

| | | |
|---|---|---|
| 2011/0158244 A1* | 6/2011 | Long et al. .................. 370/401 |
| 2012/0209557 A1 | 8/2012 | Crandall et al. |
| 2013/0158918 A1 | 6/2013 | Spanier et al. |

OTHER PUBLICATIONS

ION Technology, 7500 ION High Visibility 3-Phase Energy & Power Quality Meter, Power Measurement, specification, pp. 1-8, revision date Mar. 21, 2000.

ION Technology 7500 ION 7600 Ion High Visibility Energy and Power Quality Compliance Meters, specification, Power Measurement, pp. 1-8, revision date Nov. 30, 2000.

User' Installation & Operation and User's Programming Manual, The Futura Series, Electro Industries, pp. 1-64, (c) 1995.

Nexus 1250 Installation and Operation Manual Revision 1.20, Electro Industries/Gauge Tech, 50 pages, Nov. 8, 2000.

Nexus 1250, Precision Power Meter & Data Acquisition Node, Accumeasure(r) Technology, Electro Industries/Gauge Tech, specification, 16 pages, Nov. 1999.

Performance Power Meter & Data Acquisition Node, Electro Industries/Gauge Tech, Nexus 1250 specification, 8 pages, Dec. 14, 2000.

Futura+Series, "Advanced Power Monitoring and Analysis for the 21st Century", Electro Industries/Gauge Tech, specification, 8 pages, Apr. 13, 2000.

PowerLogic Series 4000 Circuit Monitors, pp. 1-4; Document #3020H00601; Jan. 2006.

ION7550/ion7650 PowerLogic power-monitoring units, Technical data sheets, pp. 1-12, Copyright 2006 Schneider Electric.

IEC 61000-4-15: Electromagnetic compatibility (EMC) Part 4: Testing and measuring techniques, Section 15: Flickermeter--Functional and design specifications; Cenelec--European Committee for Electrotechnical Standardization; pp. 1-25; Apr. 1998.

Postel, J.B., and Reynolds, J.K. "File Transfer Protocol (FTP)", RFC959, pp. 1-66, Oct. 1985.

Braden, R (editor), "Requirements for Internet Hosts—Application and Support", RFC 1123, pp. 1-97, Oct. 1989.

Deutsch, P., Emtage, A., and Marine, A., "How to Use Anonymous FTP", RFC1635, pp. 1-13, May 1994.

Communicator EXT 3.0 User Manual Revision 1.32, Electro Industries/Gauge Tech, 558 pages, Aug. 27, 2007.

Hubbert, "What is flat file?", Whatls.com, http://searchsqlserver.techtarget.com/definitionfilat-file, Jul. 2006, 1 pp.

Speirs, "What is binary file?", Whatls.com, http:llwhatis.techtarget.comldefinition/binary-file, Apr. 2005, 1 pp.

Zeinalipour-Yazti et al., MicroHash: an Efficient Index Structure for Flash-Based Sensor Devices, Proceeding of the 4th Conference on Usenix Conference on File and Storage Technologies, vol. 4, Dec. 2005, pp. 14.

Nexus 1250/1252 Installation and Operation Manual Revision 1.31, Electro Industries/Gauge Tech, 146 pages, Jan. 21, 2010.

Nexus 1500 Installation and Operation Manual Revision 1.03, Electro Industries/Gauge Tech, 124 pages, Jan. 4, 2010.

* cited by examiner

| Field Name | Modbus RTU | Modbus ASCII | RTU 8-Bit |
|---|---|---|---|
| Header | | 3A | |
| Device Address | 06 | 30, 36 | 0000 0110 |
| Function Code | 03 | 30, 33 | 0000 0011 |
| Start Address Hi | 00 | 30, 30 | 0000 0000 |
| Start Address Lo | 6B | 36, 42 | 0110 1001 |
| No. of Registers Hi | 00 | 30, 30 | 0000 0000 |
| No. of Registers Lo | 03 | 30, 33 | 0000 0011 |
| CHECKSUM | CRC | LRC | |
| Trailer | | 0D, 0A | |

*Fig. 3 (Prior Art)*

Status Codes

| Status Code | Description |
| --- | --- |
| 0 | Device did not respond, this is an error condition |
| 0x00AA | Completed Successfully |
| 0x00BB | Busy or in progress |
| 0x00FA | Failed |
| 0x00FF | Not Authorized |
| 0x0100 | Data Not found |
| 0x0101 | Command Code not supported |
| 0x0102 | Invalid frame length |
| 0x0103 | Invalid user data length |
| 0x0104 | User data length larger than set |
| 0x0105 | User data receive buffer not ready |
| 0x0106 | User data receive error |
| 0x0107 | Firmware update data transfer done |
| 0x0108 | Firmware update data transfer failed |
| 0x0109 | User logged on |
| 0x010A | User logged off |
| 0x010B | Firmware update in progress |
| 0x010C | Firmware update failed |
| 0x010D | Firmware update done |
| 0x010E | Firmware update idle |
| 0x010F | User security privilege restricted |
| 0x0110 | User security setting was changed, need re-logon |
| 0x0111 | File or Directory does not exist |
| 0x0112 | Already in root |
| 0x0113 | Directory already exists |
| 0x0114 | Permission denied |
| 0x0115 | Name is invalid |
| 0x0116 | File in use by another process |
| 0x0117 | Directory is not empty |
| 0x0118 | Handle does not exist |
| 0x0119 | Invalid Handle |
| 0x011A | File seek invalid |
| 0x011B | Byte count invalid |
| 0x011C | Handle in use |
| 0x011D | Disk full |
| 0x011E | File Open Error |
| 0x011F | File size is 0. |
| 0x0120 | Missed write frame with sequence number 1. |
| 0x0121 | Invalid write sequence number |

*Fig. 8*

SYSTEM AND METHOD FOR IMPROVED DATA TRANSFER FROM AN IED

PRIORITY

This application is a continuation-in-part application of U.S. patent application Ser. No. 12/061,979 filed on Apr. 3, 2008, entitled "AN INTELLIGENT ELECTRONIC DEVICE FOR RECEIVING AND SENDING DATA AT HIGH SPEEDS OVER A NETWORK", the contents of which are hereby incorporated by reference in its entirety. This application also claims priority to U.S. Provisional Application Ser. No. 61/187,885 filed on Jun. 17, 2009, entitled "SYSTEM AND METHOD FOR IMPROVED DATA TRANSFER FROM AN IED", the contents of which are hereby incorporated by reference in its entirety.

BACKGROUND

1. Field of the Invention

The present invention relates generally to an intelligent electronic device (IED), such as used by commercial, industrial, or residential customers of power utility companies and, more particularly, to methods and systems for providing easy access to an internal IED file structure.

2. Description of the Related Art

The Modbus protocol defines a message structure that controllers, such as personal computers, recognize and use, regardless of the type of networks over which they communicate. Modbus (and protocols in general) describes the process a controller uses to request access to a device, how it will respond to requests from devices and how errors will be detected and reported. Characteristically, the Modbus protocol establishes a common format for the layout and content of message fields. During communication with Modbus compatible devices, the protocol determines how each controller knows its device address, recognizes a message addressed to it, determines the kind of action to be taken and how the controller will extract any data or other information contained in the message. If a reply is required, the controller constructs a reply message and will transmit it using the Modbus protocol.

There are many reasons for using Modbus protocol over other protocols for communications between IED equipment. Some of the main reasons for the extensive use of Modbus over other communications protocols are threefold. First, it is openly published and royalty-free. Second, it is a relatively easy industrial network to deploy because it is well understood and supported by many commercial and non-commercial entities and pieces of equipment in the industry. Third, it moves raw bits or words without placing many restrictions on vendors. Modbus allows for communication between many devices connected to the same network, for example, a system that measures temperature and humidity and communicates the results to a computer. Modbus is often used to connect a supervisory computer with a remote terminal unit (RTU) in supervisory control and data acquisition (SCADA) systems.

The Modbus communication interface is built around messages. The format of these Modbus messages is independent of the type of physical interface used. For example, the same message is used on RS232 as on Modbus/TCP over Ethernet. In other words, the same basic protocol can be used regardless of the connection type or medium. A device can also communicate with several Modbus nodes, even if they are connected with different interface types, without the need to use a different protocol for every connection.

On simple interfaces like RS485 or RS232, the Modbus messages are sent without encapsulation over the network. In this case, the network is dedicated to Modbus. When using more versatile network systems like TCP/IP over Ethernet, the Modbus messages are embedded in a Modbus TCP wrapper which forms TCP/IP packets of Modbus messages. The format of Modbus TCP messages is simplified because of the robust error detection which is built into the TCP/IP protocol and is built into the Ethernet to provide error free transmissions so that the checksum which is normally part of the Modbus message in not needed. In addition, current Ethernet based networks have embedded hardware which does the error checking providing additional performance benefits. In the case of an Ethernet network, Modbus and other protocols and types of connections can co-exist at the same physical interface at the same time. The main Modbus message structure is a master (client)/slave (server) implementation which is able to function on both point-to-point and multidrop networks. The extension to Modbus TCP extends Modbus messaging to work over additional network configurations such as star, star-bus and star-ring topologies.

Standard Modbus ports use an RS-232 compatible serial interface that defines connector pin outs, cabling, signal levels, transmission baud rates and parity checking.

The Modbus protocol is a non-file centric packet protocol and each Modbus message in the protocol has the same structure. Rather than files, one of its sets of commands operates on registers, a register being a unit of information conveying 65,536 different values, i.e., a 2 byte quantity.

Four basic elements are present in each Modbus message. The sequence of these elements is the same for all messages, to make it easy to parse the content of the Modbus message. A conversation is always started by a master in the Modbus network. A Modbus master sends a message and—depending on the contents of the message—a slave takes action and responds to it.

FIG. 1. illustrates the packet structure of a Modbus message comprising a message header, including device address information, and the like, and a data field which comprises messages, data, commands and particularly register definitions of address devices for which the queries, commands and messages are directed. The device address information refers to the address of the receiver. This parameter contains one byte of information. In Modbus/ASCII, it is coded with two hexadecimal characters, in Modbus/RTU, one byte is used. Valid addresses are in the range 0 . . . 247. The values 1 . . . 247 are assigned to individual Modbus devices and 0 is used as a broadcast address. Messages sent to the latter address will be accepted by all slaves. A slave always responds to a Modbus message. When responding, it uses the same address as the master in the request. In this way, the master can see that the device is actually responding to the request.

The second parameter in each Modbus message is the function code. This defines the message type and the type of action required by the slave. The parameter contains one byte of information. In Modbus/ASCII, this is coded with two hexadecimal characters, in Modbus/RTU, one byte is used. Valid function codes are in the range 1 . . . 255. Not all Modbus devices recognize the same set of function codes.

When a slave receives a Modbus query message with function 01, the slave collects the necessary output values and constructs a response message. The length of this message is dependent on the number of values that have to be returned. In general, when N values are requested, a number of ((N+7) mod 8) bytes are necessary to store these values. The actual number of databytes in the datablock is put in the first byte of the data field.

An exemplary Modbus field content diagram is given in FIG. 2. In the Modbus exemplar of FIG. 2, Modbus message is structured to identify a communication partner by its "slave address" and define the function code for the action desired. For example, and in accordance with an exemplary Modbus query set forth in FIG. 3, a "read holding registers" request might be made to slave device address 06, requesting data from holding registers 40108, 40109, and 40110. All that is required, therefore, is to understand how a protocol message is structured and be able to determine how to populate the various fields of the message.

One pioneer IED system that incorporated features for downloading log data, via Modbus was the Nexus 1250™ meter, manufactured by Electro Industries of Long Island, N.Y. The approach for downloading log data in the Nexus 1250™ meter was to use standard Modbus commands to read a 4 Mbyte memory. However, a drawback of implementing the Modbus protocol to retrieve log data on the order of 4 Mbytes is that it cannot efficiently support large data downloads. That is, the master/slave structure imposed by Modbus results in a limited message size. More particularly, the limitations imposed by the Modbus protocol are two-fold. First, the addressing capabilities of the Modbus protocol restrict the addressing register to two bytes which imposes an upper limit of 64 k addressing capability. Secondly, the Modbus answer structure to a query provides the number of data bytes in the response in Byte 3 as a one byte number. Therefore, the number of bytes can not be greater than the largest number specified by a one byte number which is 256 bytes. Similarly, the number of bytes to be written are also limited to 256 bytes. These message size limitations imposed by the Modbus protocol result in performance issues. This unfortunately necessitates an excessively large number of messages to download large data files. For example, to retrieve a 1 megabyte Log file (i.e., 1,048,576 bytes), which has been recorded by the IED using Modbus RTU, would take 1048576/254=4096 Modbus transfers. This is problematic in that each Modbus transfer requires a query and a response message to be sent. In addition, before the IED can respond, the IED must also wait for a "dead time" when the slave is not receiving any further characters. The wait time or "dead time" is used to indicate to the slave that the message it was sent is complete. This time period is defined by the Modbus specification. The IED then has to process the query and send the response. The master is prohibited from making its next query until receiving a response from the slave so it is stalled until receiving a response. By increasing the amount of data sent for each query will therefore greatly increase the performance because it will reduce the amount messages that are sent and make the message processing by the master and slave more efficient.

Among other patentable inventions disclosed in this application, a need therefore exists at least for a system and method capable of providing easy access to the internal file structure of an IED, not presently defined or supported directly by legacy protocols used in industry, such as the Modbus protocol.

SUMMARY

According to one aspect of the present disclosure, a method for extending a non-file centric protocol to support a file-system architecture includes receiving one or more extended file centric commands at the IED from an external device in accordance with a non-file centric protocol, the extended file centric commands are configured to request one of: (a) a transfer of one or more files stored in a file system of the IED from the IED to the external device, (b) file system information pertaining to the one or more files stored in the file system of the IED, or (c) a file system operation performed on the one or more files stored in the file system of the IED. The method further comprises processing the received one or more extended file centric commands at the IED to execute one of: (a) a transfer of the one or more files to the external device from the IED, (b) a return of the file system information, or (c) a file system operation.

In a further aspect, the file system operations include: (a) appending to a file, (b) creating a directory, (c) creating a file, (d) writing data to a file, (e) overwriting a file, (f) user security status, (g) sending a username, (h) sending a password, (i) logging off, (j) changing a directory, (k) retrieving a current directory, (l) listing directory contents, (m) deleting a file/directory, (n) renaming a file/directory from, (o) renaming a file/directory to, (p) retrieving file details, (q) closing a file, (r) performing a firmware update, (s) retrieving firmware update status, (t) retrieving firmware information.

In another aspect, the non-file centric protocol is extended by extending a non-file centric command set of the non-file centric protocol to include the one or more file-centric commands.

In yet another aspect, the processing step further comprises: limiting the data transfer packet size of the file transfer to match a native packet data transfer size of a network transfer protocol to optimize the transfer of the one or more files from the IED to the external device, responsive to a request to transfer of one or more files stored in the file system of the IED.

In one aspect, the network transfer protocol is the Ethernet protocol.

In another aspect, the non-file centric protocol is the Modbus protocol.

According to another aspect of the present disclosure, a system for extending a non-file centric protocol to support a file-system architecture in an IED, the system comprises: a network interface of the IED configured to receive one or more extended file centric commands at the IED from an external device in accordance with a non-file centric protocol, the extended file centric commands configured to request one of: (a) a transfer of one or more files stored in a file system of the IED, (b) file system information pertaining to the one or more files stored in the file system of the IED from the IED, (c) a file system operation performed on the one or more files stored in the file system of the IED, (d) a compression operation performed on one or more files stored in the file system of the IED, (e) an encryption operation performed on one or more files stored in the file system of the IED; and a processor of the IED configured to process the received one or more extended file centric commands at the IED to execute one of: (a) a transfer of the one or more files to the external device from the IED, (b) a return the file system information, (c) a file system operation, (d) a compression operation, (e) an encryption operation.

In a further aspect, the system further includes means for extending a non-file centric command set of a non-file centric protocol to include one or more file-centric commands.

According to yet another aspect of the present disclosure, a method is provided for optimizing the transfer of data to/from an IED, the method comprising: receiving a command at the IED from an external device, the command configured to request one of: (a) a transfer of a compressed block of data from the IED to the external device, (b) a transfer of one or more compressed files from the IED to the external device; (c) a transfer of a compressed block of data from the external device to the IED, (d) a transfer of one or more compressed files from the external device to the IED; processing the received command at the IED to execute one of: (a) a transfer of the compressed block of data from the IED to the external device, (b) a transfer of the one or more compressed files from the IED to the external device (c) a transfer of the compressed block of data from the external device to the IED, (d) a transfer of the one or more compressed files from the external device to the IED; decompressing the compressed block of data transferred to the IED in the case where a compressed block of data is transferred to the IED; decompressing the compressed files transferred to the IED in the case where the compressed files are transferred to the IED.

In one aspect, the files are stored in a file system of the IED.

According to still another aspect of the present disclosure, a method is provided for optimizing the transfer of data to/from an IED, the method comprising: receiving a command at the IED from an external device, the command configured to request one of: (a) a compression of a block of data, (b) a compression of files stored in a file system of the IED; processing the received command at the IED to execute one of: (a) a compression of the block of data, (b) a compression of the files stored in the file system of the IED.

Accordingly to a further aspect of the present disclosure, a method is provided for optimizing the transfer of data to/from an IED, the method comprising: receiving a command at the IED from an external device, the command configured to request one of: (a) the compression of a block of data, (b) the compression of file stored in a file system of the IED; processing the received command at the IED in the case where the IED receives a request to compress a block of data to execute: (a) a compression of the block of data; and (b) a transmission of the compressed block of data from the IED to the external device; processing the received command at the IED in the case where the IED receives a request to compress files stored in a file system of the IED to execute: (a) a compression of the files; and (b) a transmission of the compressed files from the IED to the external device.

According to a further aspect of the present disclosure, a method is provided for optimizing the transfer of data to/from an IED, the method comprising: receiving a command at the IED from an external device, the command configured to request one of: (a) a transfer of a block of data from the IED to the external device; (b) a transfer of one or more files from the IED to the external device; processing the received command at the IED to execute: (a) a compression of the block of data; and (b) a transfer of the compressed block of data from the IED to the external device, in the case where the IED receives a request to transfer a block of data; processing the received command at the IED in the case where the IED receives a request to transfer the files to execute: (a) a compression of the requested files; and (b) a transfer of the compressed files from the IED to the external device.

According to a further aspect of the present disclosure, a method is provided for extending a command set of a file-centric protocol, the method comprising: embedding a command as parameters of a file-centric protocol command; transmitting the file-centric command to the IED from an external device; and interpreting the command in the IED as a command to perform an operation by the IED.

In a further aspect, the command is an extended command that extends the command set of the file-centric protocol.

In one aspect, the extended command is an encryption command.

In another aspect, the extended command is a compression command.

In yet another aspect, the parameters are embedded in the path and file name of the file-centric protocol command.

In a further aspect, the extended command set conforms to the file-centric protocol architecture.

In yet another aspect, the command is non-file centric protocol command.

In still another aspect, the non-file centric protocol command is a Modbus command.

According to a further aspect of the present disclosure, a method is provided for extending a command set of a file-centric protocol, the method comprising: embedding one or more commands in a file to be transmitted to the IED; parsing the file at the IED to extract the one or more embedded commands; executing the extracted one or more embedded commands by the IED.

According to an aspect of the present disclosure, a method for facilitating the transfer of information from a file system of an intelligent electronic device (IED) to an external device is provided, the method including a) storing file transfer meta-data in a plurality of holding registers of the IED; b) zeroing out a user flags holding register; and c) writing an appropriate command code to a user command code register to perform a desired operation which acts on the file transfer meta-data previously stored in the plurality of holding registers at said step (a). The plurality of holding registers include at least one user flag holding register, at least one user command code holding register, at least one user sub-command holding register, at least one status code register, at least one user data length holding register and at least one user data holding register.

In one aspect, the step of storing file transfer meta-data in a plurality of holding registers of the IED comprises storing particular user codes which represent supplemental information in the case where data is transferred in multiple frames.

In another aspect, the step of storing file transfer meta-data in a plurality of holding registers of the IED comprises storing one of a file or directory command in the at least one user command code flag holding register to store a primary user defined command code.

In a further aspect, the step of storing file transfer meta-data in a plurality of holding registers of the IED comprises storing a sequence number in the at least one user sub-command code flag holding register, wherein the sequence number is sequentially incremented for each frame transfer in a multi-frame transfer.

In yet another aspect, the step of storing file transfer meta-data in a plurality of holding registers of the IED comprises storing a status code in the at least one status code register indicating the success or failure of an attempted operation.

In another aspect, the step of storing file transfer meta-data in a plurality of holding registers of the IED comprises storing the user length of a transmitted frame in the at least one user data length holding register. In certain embodiments, the user data length is restricted to 512 bytes.

In a further aspect, the step of storing file transfer meta-data in a plurality of holding registers of the IED comprises storing a status code in the at least one status code register indicating the success or failure of an attempted operation.

In one aspect, the method further includes a step of determining a number of registers to allocate to each of the plurality of holding registers, including determining a number of bytes needed for a particular holding register type; and dividing the number of bytes needed for the particular holding register type by two.

According to another aspect of the present disclosure, a method for facilitating the transfer of information from a file system of an intelligent electronic device (IED) to an external device is provided, the method including a) embedding file transfer meta-data in a custom function code; and b) executing the custom function code to transfer information from a file system of the IED to the external device in a single operation.

In one aspect, the custom function code is comprised of a plurality of fields, wherein the plurality of fields conform to the Modbus protocol.

In a further aspect, the custom function protocol in accordance with the Modbus protocol includes at least 10 fields, wherein the 10 fields include: a device address field, a custom function code field, a frame length field, a user flags field, a user command code field, a user sub-command code field, a status code field, a user data length field, a user data field and a checksum field.

The above and other aspects, features, and advantages of the present disclosure will become more apparent in light of the following detailed description when taken in conjunction with the accompanying drawings.

BRIEF DESCRIPTION OF THE DRAWINGS

FIG. 3 is a simplified chart of exemplary Modbus fields including hexadecimal, ASCII, and RTU 8-bit representations;

FIG. 8 is a table illustrating exemplary user status codes.

Figure 1:
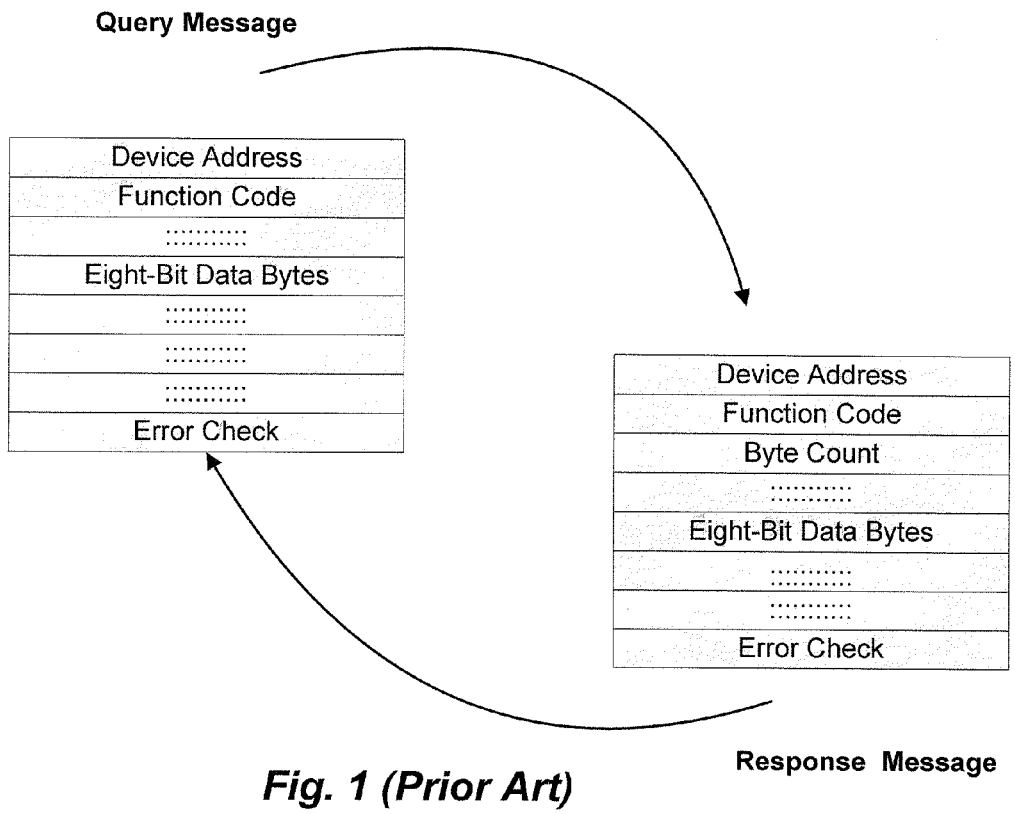
FIG. 1 is a simplified query/response message exchange in accordance with a Modbus protocol.
Figure 2:
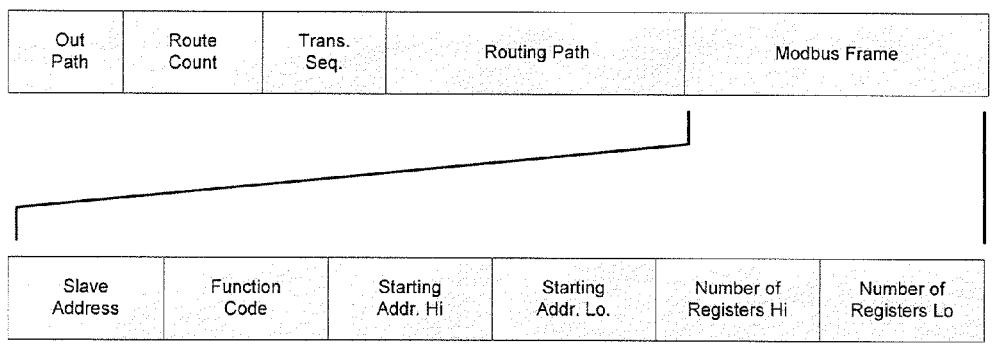
FIG. 2 is a simplified message field structure suitable for a Modbus protocol.

To facilitate understanding, identical reference numerals have been used, where possible, to designate identical elements that are common to the figures, except that alphanumerical suffixes may be added, when appropriate, to differentiate such elements. The images in the drawings are simplified for illustrative purposes and are not depicted to scale.

The appended drawings illustrate exemplary embodiments of the present disclosure and, as such, should not be considered as limiting the scope of the disclosure that may admit to other equally effective embodiments. Correspondingly, it has been contemplated that features or steps of one embodiment may beneficially be incorporated in other embodiments without further recitation.

In some embodiments, particular method steps of the discussed methods are performed in the depicted order. In alternate embodiments, in the respective methods, at least two method steps or portions thereof may be performed contemporaneously, in parallel, or in a different order.

DETAILED DESCRIPTION OF THE PREFERRED EMBODIMENTS

It should be understood that the elements shown in the figures may be implemented in various forms of hardware, software or combinations thereof. Preferably, these elements are implemented in a combination of hardware and software on one or more appropriately programmed general-purpose devices, which may include a processor, memory and input/output interfaces.

The present description illustrates the principles of the present disclosure. It will thus be appreciated that those skilled in the art will be able to devise various arrangements that, although not explicitly described or shown herein, embody the principles of the disclosure and are included within its spirit and scope.

All examples and conditional language recited herein are intended for pedagogical purposes to aid the reader in understanding the principles of the disclosure and the concepts contributed by the inventor to furthering the art, and are to be construed as being without limitation to such specifically recited examples and conditions.

Moreover, all statements herein reciting principles, aspects, and embodiments of the disclosure, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

Thus, for example, it will be appreciated by those skilled in the art that the block diagrams presented herein represent conceptual views of illustrative circuitry embodying the principles of the disclosure. Similarly, it will be appreciated that any flow charts, flow diagrams, state transition diagrams, pseudo-code, and the like represent various processes which may be substantially represented in computer readable media and so executed by a computer or processor, whether or not such computer or processor is explicitly shown.

The functions of the various elements shown in the figures may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor ("DSP") hardware, read only memory ("ROM") for storing software, random access memory ("RAM"), and nonvolatile storage.

Other hardware, conventional and/or custom, may also be included. Similarly, any switches shown in the figures are conceptual only. Their function may be carried out through the operation of program logic, through dedicated logic, through the interaction of program control and dedicated logic, or even manually, the particular technique being selectable by the implementer as more specifically understood from the context.

Aspects of the present disclosure are illustratively described herein within the context of intelligent electronic devices ("IEDs") such as power quality analyzers, including portable and accuracy certifiable power quality analyzers. The term "power quality analyzers" is broadly used herein in reference to IEDs adapted to record, measure, and communicate at least some of parameters of waveforms of voltages and currents of a respective electrical service, including their harmonics, transients, ripples, and other disturbances. The term "portable" is used in reference to the power quality analyzers to denote transportability of such IEDs and ability thereof for momentarily, temporary, and permanent connectivity to respective electrical services and communication networks.

It will be appreciated by those skilled in the art that the disclosure may also be utilized within the context of other IEDs, including Programmable Logic Controllers (PLC's), Remote Terminal Units (RTUs), protective relays, fault recorders, and meters, among other devices or systems used to manage and control quality, distribution, and consumption of electrical power. A meter is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering.

The word "exemplary" is used herein to mean "serving as an example, instance, or illustration." Any configuration or design described herein as "exemplary" is not necessarily to be construed as preferred or advantageous over other configurations or designs. Herein, the term "coupled" or phrase "coupled with" is defined to mean directly connected to or indirectly connected with through one or more intermediate components. Such intermediate components may include both hardware and software based components.

Figure 4:
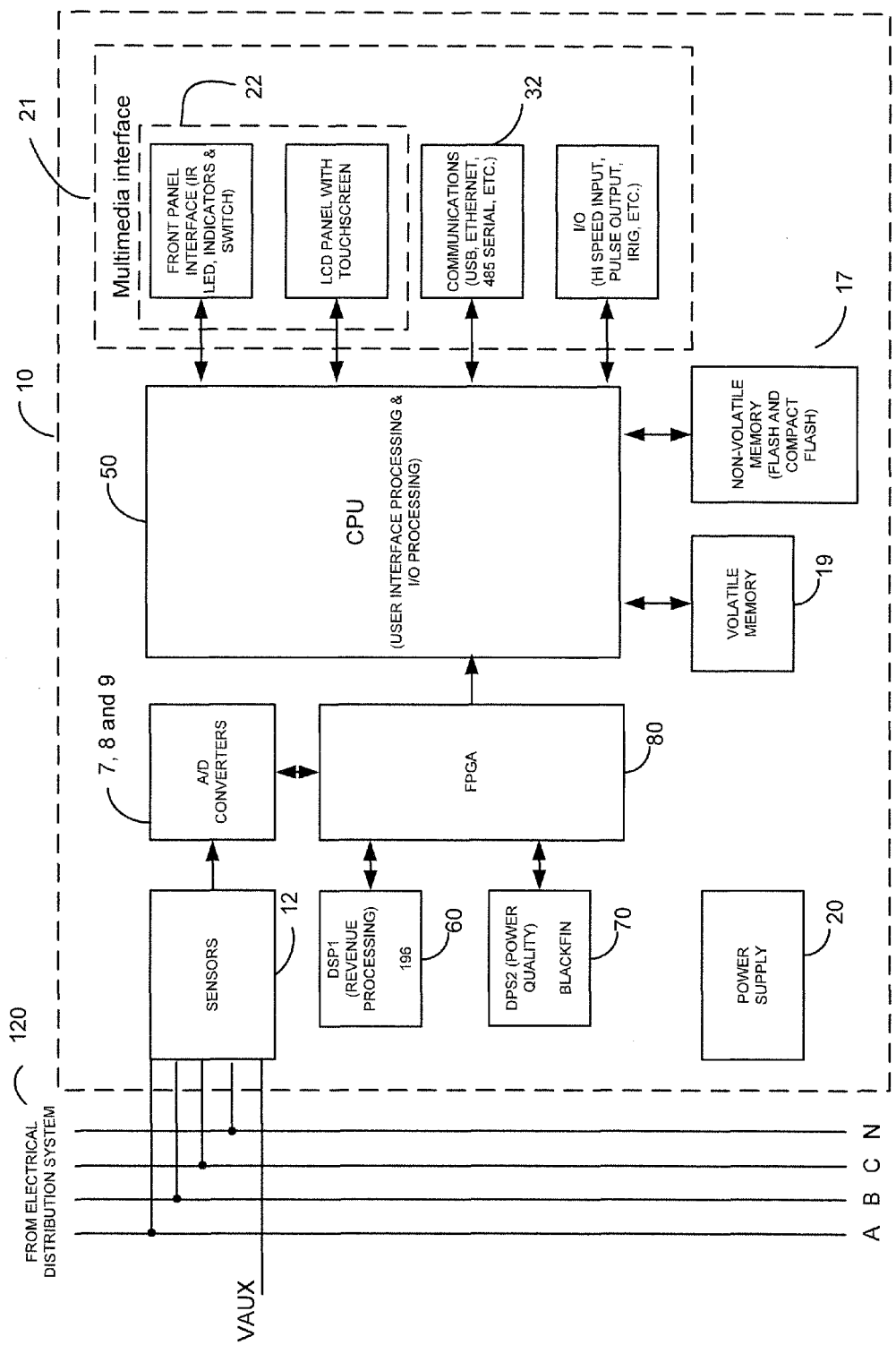
FIG. 4 is a diagram of an intelligent electronic device in accordance with an embodiment of the present disclosure.

An intelligent electronic device (IED) 10 for monitoring and determining an amount of electrical power usage by a consumer is illustrated in FIG. 4.

The IED 10 of FIG. 1 includes sensors 12 coupled to various phases A, B, C of an electrical distribution system 120, analog-to-digital (ND) converters 7, 8, 9, including inputs coupled to the sensor 12 outputs, a power supply 20, a volatile memory 19, an non-volatile memory 17, a multimedia user interface 21, and a processing system that includes at least one central processing unit (CPU) 50 (or host processor) and one or more digital signal processors, two of which are shown, i.e., DSP1 60 and DSP2 70. The IED 10 also includes a Field Programmable Gate Array (FPGA) 80 which performs a number of functions, including, but not limited to, acting as a communications gateway for routing data between the various processors 50, 60, 70, receiving data from the A/D converters 7, 8, 9, performing transient detection and capture and performing memory decoding for CPU 50 and the DSP processor 60. The FPGA 80 is internally comprised of two dual port memories to facilitate the various functions, as will be described further below.

The sensors 12 sense electrical parameters, e.g., voltage and current, on incoming lines, (i.e., phase A, phase B, phase C), from an electrical power distribution system 120.

A/D converters 7, 8, 9 are respectively configured to convert an analog voltage or current signal to a digital signal that is transmitted to a gate array, such as Field Programmable Gate Array (FPGA) 80. The digital signal is then transmitted from the FPGA 80 to the CPU 50 and/or one or more DSP processors 60, 70 to be processed in a manner to be described below.

The CPU 50 or DSP Processors 60, 70 are configured to operatively receive digital signals from the A/D converters 7, 8 and 9 to perform calculations necessary to determine power usage and to control the overall operations of the IED 10. In some embodiments, CPU 50, DSP1 60 and DSP2 70 may be combined into a single processor, serving the functions of each component. In some embodiments, it is contemplated to use an Erasable Programmable Logic Device (EPLD) or a Complex Programmable Logic Device (CPLD) or any other well-known or envisioned programmable logic device or processor in place of the FPGA 80. In some embodiments, the digital samples, which are output from the A/D converters 7, 8, 9 are sent directly to the CPU 50 or DSP processors 60, 70, effectively bypassing the FPGA 80 as a communications gateway.

The power supply 20 provides power to each component of the IED 10. Preferably, the power supply 20 is a transformer with its primary windings coupled to the incoming power distribution lines and having windings to provide a nominal voltage, e.g., 5VDC, +12VDC and –12VDC, at its secondary windings. In other embodiments, power may be supplied from an independent power source to the power supply 20. For example, power may be supplied from a different electrical circuit or an uninterruptible power supply (UPS).

In one embodiment, the power supply 20 can be a switch mode power supply in which the primary AC signal will be converted to a form of DC signal and then switched at high frequency, such as, for example, 100 Khz, and then brought through a transformer to step the primary voltage down to, for example, 5 Volts AC. A rectifier and a regulating circuit would then be used to regulate the voltage and provide a stable DC low voltage output. Other embodiments, such as, but not limited to, linear power supplies or capacitor dividing power supplies are also contemplated.

The multimedia user interface 21 is shown coupled to the CPU 50 in FIG. 1 for interacting with a user and for communicating events, such as alarms and instructions to the user. The multimedia user interface 21 preferably includes a display 22 for providing visual indications to the user. The display may be embodied as a touch screen, a liquid crystal display (LCD), LED number segments, individual light bulbs or any combination. The display 22 may provide information to the user in the form of alphanumeric lines, computer-generated graphics, videos, animations, etc. The multimedia user interface 21 further includes a speaker or audible output means for audibly producing instructions, alarms, data, etc. The speaker is directly or indirectly coupled to the CPU 50 via a digital-to-analog converter (D/A) for converting digital audio files stored in a memory, e.g., non-volatile memory 17 or volatile memory 19, to analog signals playable by the speaker. An exemplary interface is disclosed and described in commonly owned co-pending U.S. application Ser. No. 11/589,381, entitled "POWER METER HAVING AUDIBLE AND VISUAL INTERFACE", which claims priority to U.S. Provisional Patent Appl. No. 60/731,006, filed Oct. 28, 2005, the contents of which are hereby incorporated by reference in their entireties.

The IED 10 will support various file types including but not limited to Microsoft® Windows® Media Video files (.wmv), Microsoft® Photo Story files (.asf), Microsoft® Windows® Media Audio files (.wma), MP3 audio files (.mp3), JPEG image files (.jpg, .jpeg, .jpe, .jfif), MPEG movie files (.mpeg, .mpg, .mpe, .m1v, .mp2v .mpeg2), Microsoft Microsoft® Recorded TV Show files (.dvr-ms), Microsoft Windows Video files (.avi) and Microsoft Windows® Audio files (.wav).

The IED 10 may communicate to a server or other computing device via a communication network. The IED 10 may be connected to a communications network, e.g., the Internet, by any known means, for example, a hardwired or wireless connection, such as dial-up, hardwired, cable, DSL, satellite, cellular, PCS, wireless transmission (e.g., 802.11a/b/g), etc. It is to be appreciated that the network may be a local area network (LAN), wide area network (WAN), the Internet or any known network that couples computers to enable various modes of communication via network messages. Furthermore, the server will communicate using the various known protocols such as Transmission Control Protocol/Internet Protocol (TCP/IP), File Transfer Protocol (FTP), Hypertext Transfer Protocol (HTTP), etc. and secure protocols such as Internet Protocol Security Protocol (IPSec), Point-to-Point Tunneling Protocol (PPTP), Secure Sockets Layer (SSL) Protocol, etc. The server will further include a storage medium for storing a database of instructional videos, operating manuals, etc., the details of which will be described in detail below.

The IED 10 further comprises a volatile memory 19 and a non-volatile memory 17. In addition to storing audio and/or video files, volatile memory 19 will store the sensed and generated data for further processing and for retrieval when called upon to be displayed at the IED 10 or from a remote location. The volatile memory 19 includes memory such as but not limited to: random access memory (RAM), FRAM, Flash, or other volatile or non-volatile storage. The volatile memory will work with the at least one processor and the non-volatile memory will also be used to store data for later retrieval. Such non-volatile memory may include permanently affixed memory or removable memory such as magnetic storage memory; optical storage memory, e.g., the various known types of CD and DVD media; solid-state storage memory, e.g., a CompactFlash card, a Memory Stick, SmartMedia card, MultiMediaCard (MMC), SD (Secure Digital) memory; or any other memory storage that exists currently or will exist in the future. By utilizing removable memory, an IED can be easily upgraded as needed. Such memory will be used for storing historical trends, waveform captures, event logs including timestamps and stored digital samples for later downloading to a client application, web-server or PC application.

In a further embodiment, the IED 10 will include a communication device 32 for enabling communications between the IED 10, and a remote terminal unit, programmable logic controller and other computing devices, microprocessors, a desktop computer, laptop computer, other meter modules, etc. The communication device 32 may be a modem, network interface card (NIC), wireless transceiver, etc. The communication device 32 will perform its functionality by hardwired and/or wireless connectivity. The hardwire connection may include but is not limited to hard wire cabling e.g., parallel or serial cables, RS232, RS485, USB cable, FireWire™ (1394 connectivity) cables, Ethernet, Fiber Optic, Fiber Optic over Ethernet, and the appropriate communication port configuration. The wireless connection will operate under any of the various known wireless protocols including but not limited to Bluetooth™ interconnectivity, infrared connectivity, radio transmission connectivity including computer digital signal broadcasting and reception commonly referred to as WiFi™ -or 802.11.X (where x denotes the type of transmission), satellite transmission or any other type of communication protocols, communication architecture or systems currently existing or to be developed for wirelessly transmitting data including spread spectrum 900 MHz, or other frequencies, ZiqBee®, WiFi™, or any mesh enabled wireless communication.

In an additional embodiment, the IED will also have the capability of not only digitizing the sensed at least one voltage or current waveform, but storing the waveform and transferring that data upstream to a central computer, e.g., a remote server, when an event occurs such as a voltage surge or sag or a current short circuit. This data will be triggered and captured on an event, stored to memory, e.g., non-volatile RAM, and additionally transferred to a host computer within the existing communication infrastructure either immediately in response to a request from a remote device or computer to receive the data in response to a polled request. The digitized waveform will also allow the CPU 50 to compute other electrical parameters such as harmonic magnitudes, harmonic phase angles, symmetrical components, phasor analysis, and phase imbalances. Using the harmonics, the IED 10 will also calculate dangerous heating conditions and can provide harmonic transformer derating based on harmonics found in the current waveform. Harmonics will be calculated using a Fourier Transform analysis based on digital samples from the IED A/D converters. The Fourier Transform will provide both harmonic magnitude and phase angles for each harmonic to at least the 128th order, or generally under Nyquist, half the sampling speed. Note there may be other techniques utilized to calculate harmonics. These techniques would be contemplated as part of this disclosure.

In a further embodiment, the IED 10 will execute an e-mail client and will send e-mails to the utility or to the customer direct on an occasion that a power quality event occurs. This allows utility companies to dispatch crews to repair the condition. The data generated by the meters are used to diagnose the cause of the condition. The data is transferred through the infrastructure created by the electrical power distribution system. The e-mail client will utilize a POP3 or other standard mail protocol. A user will program the outgoing mail server and e-mail address into the meter. An exemplary embodiment of said metering device is disclosed in U.S. Pat. No. 6,751,563, which all contents thereof are incorporated by reference herein.

Additionally, e-mails can be sent by the IED to transfer data to other computers or IEDs. Such data could include data logs, waveform records, kWh usage, etc. The e-mail feature can also be used to provide maintenance information, such as IED firmware versions, failure alerts, user configured alerts, or other such information. It is also anticipated in this application that e-mails can be sent to the IED, including above mentioned data and also to include maintenance items such as firmware upgrades, new programmable settings, new user configured requirements, or other such information that may be desired to be stored or incorporated into or a part of the IED.

The techniques of the present disclosure can be used to automatically maintain program data and provide field wide updates upon which IED firmware and/or software can be upgraded. An event command can be issued by a user, on a schedule or by digital communication that will trigger the IED to access a remote server and obtain the new program code. This will ensure that program data will also be maintained allowing the user to be assured that all information is displayed identically on all units.

It is to be understood that the present disclosure may be implemented in various forms of hardware, software, firmware, special purpose processors, or a combination thereof. The IED also includes an operating system and micro instruction code. The various processes and functions described herein may either be part of the micro instruction code or part of an application program (or a combination thereof) which is executed via the operating system.

It is to be further understood that because some of the constituent system components and method steps depicted in the accompanying figures may be implemented in software, the actual connections between the system components (or the process steps) may differ depending upon the manner in which the present disclosure is programmed. Given the teachings of the present disclosure provided herein, one of ordinary skill in the related art will be able to contemplate these and similar implementations or configurations of the present disclosure.

It is to be further understood that while the examples described herein for all of the described embodiments are made with respect to Modbus RTU, however, the systems and methods are more generally applicable to support both Modbus RTU and Modbus TCP. Those knowledgeable in the art will understand how to make any necessary modifications to the provided descriptions to convert the examples from Modbus RTU to Modbus TCP. It is further understood that the embodiments of the present disclosure could be further expanded to include other and additional protocols which could be used to supplement or replace the described Modbus implementation. Other protocols envisioned by the inventor include but are not limited to FTP (File Transfer Protocol), HTTP (HyperText Transfer Protocol), XML (eXtensible Markup Language), SMTP (Simple Mail Transfer Protocol) any other encapsulated TCP/IP wrapped serial protocol, any binary protocol, any ASCII protocol, any TCP/IP protocol or any other protocol.

Historically, log data in an IED was not stored in a file structure but was instead simply stored as data elements in a large internal memory and recalled as log data. The large internal memory could be, for example, a flash memory. More recently, however, true file structures were created in present day IEDs and which may be compatible and directly readable by personal computers by placing a memory device such as a compact flash in a reader attached to the personal computer (PC) and in which the compact flash is formatted for the DOS operating system which is understood by all PC's. The most that could be stored in flash memory or RAM was in the order of a few Megabytes, not Gigabytes as is true today. No one had Gigabyte storage capability because of its large physical size and cost, which also requires a file system to properly organize the different types of logs and other data.

The Nexus 1500™, manufactured by Electro Industries of Long Island, N.Y., includes screen meter files or IED XML files and firmware files and is representative of an IED that incorporates a true file structure.

To read the log data, a user would assign a certain portion of the IED memory as holding registers in compliance with the Modbus protocol for transmitting/receiving data in response to Modbus data requests. A maximum of 128 kbyte (=64 k registers) portion of IED memory can be assigned as holding registers. Log data was typically stored in a large memory in the IED, for example, a 4 Mbyte memory. A memory on the order of 4 Mbytes is not directly addressable by a single Modbus command because it is too large to fit into the Modbus address map, which, as indicated above, is limited to 64 k registers.

Figure 5A:
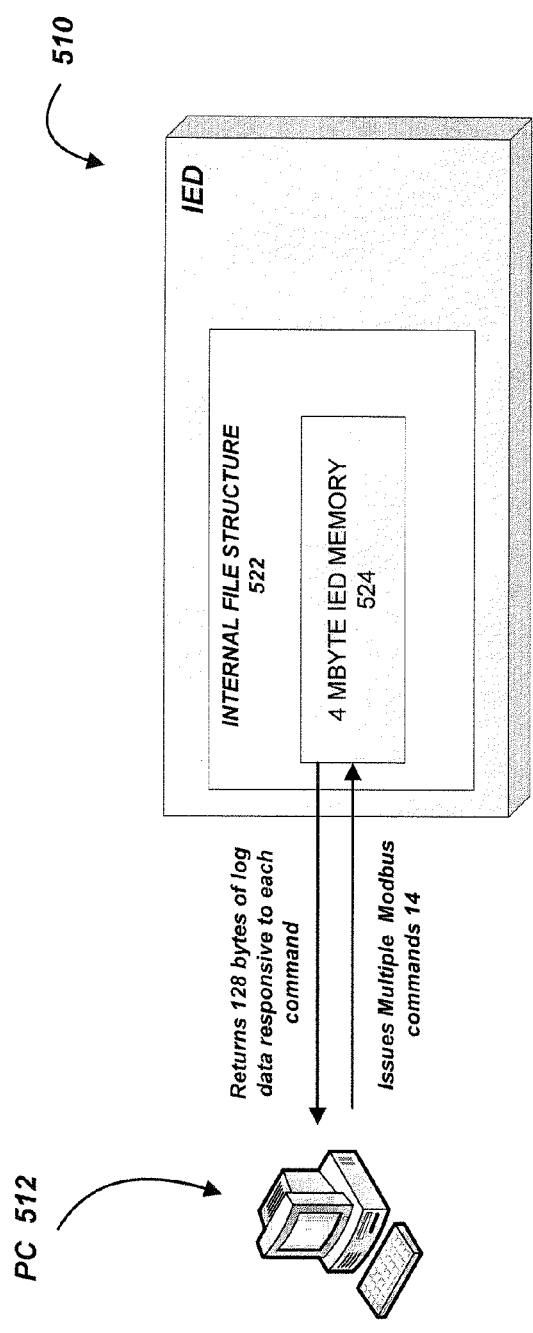
FIG. 5 illustrates a representative master and slave device for downloading log data in accordance with the present disclosure.

Referring now to FIG. 5a, a system for accessing large amounts of data from an internal IED file structure 522 of an IED 510 is illustrated. The large amount of data could be, for example, a file or files from a file system 522 of the IED 510, or a file(s) stored in RAM or a flash memory device 524 of the IED 10 as shown in Fig. 4, or data generated dynamically by the IED 510. In the system, a user is equipped with a wired or wireless access device 512 for accessing the internal IED file structure 522 in the IED 510. The access device may be any device capable of communicating over a network to retrieve remote data, for example, a desktop computer, a laptop computer, a PDA, a mobile phone, etc., and a network such as an Ethernet network or a RS-485 network. In the presently described exemplary embodiment, the access device is embodied as a PC 512. In accordance with the Modbus protocol, PC 512 is referred to as a Master device and the IED 510 is referred to herein as a Slave device.

Figure 5B:
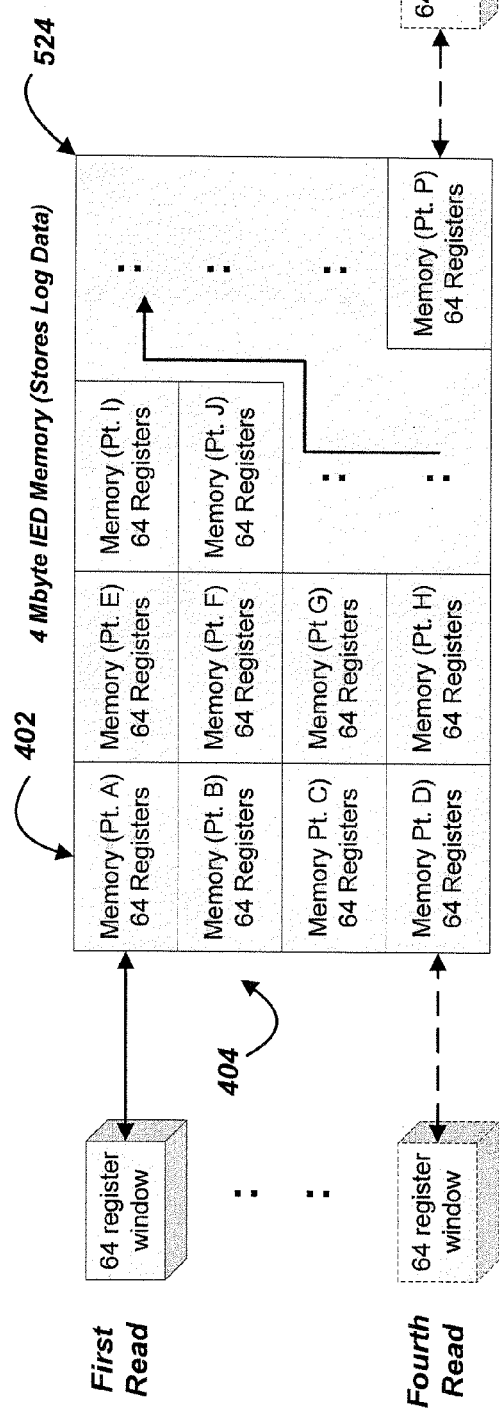

To retrieve log data from the internal file structure 522 of the IED 510, PC 512 issues multiple Modbus commands to retrieve log data in 128 byte increments utilizing a 64 register window 402, such as the one shown in FIG. 5b. In the exemplary embodiment, incremental portions of the 4 Mbyte memory 524 are sequentially read in 64 register increments. Each register read from the memory 524 comprises effectively reading two bytes of memory. Therefore, a single Modbus read command issued by PC 512 returns 64 registers worth or, equivalently, 128 bytes of log data. Reading the entire memory 524 requires issuing 31,250 consecutive read commands.

To facilitate the process of reading log data from the memory 524, an auto indexing feature was incorporated in the firmware of the IED 510 configured to automatically increment the address pointer 404 of the next Modbus read command to point to the next 64 register block in the memory 524 when the last register is read from the last 64 register block in a current read command.

To implement such an auto-indexing feature to read log data from the memory 524, a read command is issued by PC 512, an address pointer field which contains a value that points to the starting register of the first 64 segment (i.e., Pt. A 402) of the memory 524. All of the log data contained in the first 64 register segment of the memory 524 is returned by the IED in response to the first read command. The read command includes a field code to execute the read command multiple times, each time reading the next 64 register segment of the memory until all of the Log data is retrieved from the memory 524.

The approach described above for reading log data from the internal memory 524 of the IED 510 using an auto-indexing feature suffers from a number of deficiencies For example, one deficiency is the need to indirectly address a large memory (e.g., 4 Mbytes). A second limitation is the size of the register window being limited to 64 registers for a single read command. This limitation is a self-imposed limitation to conserve the number of holding registers used by the IED 510. Lastly, the approach is limited in being able to read only 128 bytes at once (i.e., using a single Modbus read command). This last limitation is a result of the Modbus protocol having a byte count field having a range of 0-254, and further in consideration of the fact that, in accordance with the Modbus protocol, the smallest element that can be read is a register which is two bytes wide. There the number of bytes retrieved when registers are read will always be an even number of bytes since each register is a pair of bytes. Accordingly, the maximum number of registers read in a single command was intentionally reduced from 128 to 64 because 128 cannot be read by a standard Modbus command due to the byte count limitation.

To overcome the limitations described above it was contemplated to modify the MODBUS read command by increasing the size of the byte count field from one byte to two bytes. In this manner, the range of holding registers that may be addressed in a single MODBUS read command is extended from 127 holding registers (1 byte addressability) to over 64 k holding registers (2 byte addressability). This constitutes a 500 fold increase in addressability. It should be understood that the prior limitation of 127 holding registers was in actually 64 registers for the reasons described above.

It should be appreciated that while the modification to the read command overcomes the third limitation, described above. That is, being restricted to address no more than 64 holding registers in a single read command, the other two afore-mentioned limitations remain. Namely, having to indirectly address a large memory (e.g., 4 Mbytes) and having a restricted window size, due to an intentional conservation of the use of the holding registers.

Described Embodiments

The techniques of the present disclosure can be used to efficiently support large data downloads from the internal file system of an IED which overcomes the inherent transfer limitations imposed by Non File Centric legacy Protocols such as Modbus and DNP. As is well known, these Non File Centric legacy Protocols do not support file system commands. To overcome this limitation, all of the embodiments described herein share a common objective directed to supporting the internal file system (e.g., of an IED) via a Non File Centric Protocol. In one embodiment, standard and user created Modbus function codes support such an internal file system of an IED by using the standard Modbus function codes with the holding registers of the IED to facilitate data transfers from a File System of the IED. In another embodiment, custom function codes are created which incorporate the Modbus function codes as parameters of the custom function codes.

Table I is a table that illustrates a non-exhaustive list of user created file Modbus function codes that may be employed in accordance with the described embodiments. It should be understood that these are shown merely by way of example and not limitation. That is, the commands illustrated in Table I represent a very small subset of commands that can be created by a user as system commands to be deployed in accordance with the embodiments described herein for supporting of an internal file system (e.g., of an IED) via a Non File Centric Protocol. In one embodiment, commands such as those shown in Table I are inserted into the holding registers of the IED to facilitate data transfers from a File System of the IED. In another embodiment, by using a single custom Function code which uses none of the Modbus Holding or Input Registers, commands such as those shown in Table I are embedded in the custom Function code to facilitate data transfers from a File System of the IED. In addition because the Modbus Holding register map has not been modified, the implementation described in the present embodiment is fully compatible with legacy implementations, such as those described above.

TABLE I

| Command Code | Description | |
|---|---|---|
| 1 | Device ID | Device returned ID string in user data field: Nexus 15xx |
| 2 | Device Reset, meter hardware reset. | User must logon first. |
| 4 | Firmware Update | For request message, user send firmware file in the user data field for up to 1408 bytes, user set the firmware file total length in the user data length field. For response message, ACK flag will be set. For additional requests, user set the ACK flag, user set additional user data in user data field for up to 1408 bytes. |
| 5 | Abort transmission | Terminate multi-framed data transfer. |
| 6 | Get current data output transfer window size | Data output transfer window size is configurable by user. The default value is 1408. |
| 7 | Set current data output transfer window size | User configurable. Valid value ranges from 64 to 1408, increment of 64. |
| 10 | User Security Status | User log on sequence is Username first then followed by Password. Wrong sequence will terminate the logon process. |
| 11 | Send Username | XOR masked username with 0x45, 'E', in user data field. |
| 12 | Send Password | XOR mask for password with 0x49, 'I', in user data field. |
| 13 | Logoff | Device will clear security privileges for the current connection. |
| 20 | Firmware update status | With current status code and text message. |
| 21 | Firmware info | Firmware information in text. |
| 30 | Change Directory | Allows the changing of the current directory to different one |
| 31 | Get Current Directory | Returns the complete path and the current directory |
| 32 | List Directory Contents | Returns the contents of the current directory |
| 33 | Create Directory | Creates a directory in the file system in a writeable directory |
| 34 | Delete File/Directory | Deletes a file or an empty directory from the file system |
| 35 | Rename File/Directory From | Renames a file or a directory from |
| 36 | Rename File/Directory To | Renames a file or a directory to |
| 37 | Read File | Reads bytes from a file |

TABLE I-continued

| Command Code | Description | |
|---|---|---|
| 38 | Write File | Writes bytes to a file |
| 39 | Get File Details | Returns the file details (Size, Date & Time, and file attributes) |
| 40 | Close File | Close file |
| 65536 | List of user defined functions for this device. | TBD |
| 65537 | Execute 1$^{st}$ user defined function. | TBD |
| 65538 . . . 65600 | | |

In one embodiment, certain holding registers of the IED are used to facilitate data transfers from a File System of the IED.

In the presently described embodiment, a process for effecting data transfers from the File System of the IED to an external device such as a PC is achieved by having a user set up necessary file data transfer information in certain pre-defined holding registers of the IED. For example, Table II illustrates, by way of example, six sets of holding registers of an IED that are set-up by a user to store necessary file data transfer information to effect a data transfer from the File System of the IED according to the presently described embodiment. Each set comprising two (2) holding registers.

TABLE II

| Holding Register Description | # of Bytes | Holding Register Modbus Map Location | # of Registers Used |
|---|---|---|---|
| User Flags Holding Register | 4 bytes | 0x8100-0x8101 | 2 registers |
| User Command Code Holding Register | 4 bytes | 0x8102-0x8103 | 2 registers |
| User Sub-Command Holding Register | 4 bytes | 0x8104-0x8105 | 2 registers |

TABLE II-continued

| Holding Register Description | # of Bytes | Holding Register Modbus Map Location | # of Registers Used |
|---|---|---|---|
| Status Code Holding Register | 4 bytes | 0x8106-0x8107 | 2 registers |
| User Data Length Holding Register | 4 bytes | 0x8108-0x8109 | 2 registers |
| User Data Holding Register | 512 bytes (max) | 0x810A-0x8209 | 256 registers |

It should be appreciated that the number of bytes allocated to the respective holding registers shown in Table II is selected only on the basis of implementation needs. In general, any number of bytes may be allocated to the respective holding registers with the only limitation being the overall number of holding registers made available in the IED. It should further be appreciated that the Modbus Map locations chosen for the holding registers were selected for ease of explanation and should not be construed as limiting the scope of the present disclosure. Finally, once the number of bytes is determined for a particular holding register, the number of registers is determined according to the formula, # of registers=# of bytes/2.

I. Holding Register Descriptions

I.1—User-Flag Holding Register

The "User Flags" holding register is a four-byte register and is used for entering particular user codes for providing supplemental information in the case of transferring data in multiple frames or indicating a last or final user data transfer or otherwise indicating a file or directory command is being executed. Table III further describes this supplemental information.

TABLE III

Supplemental Information

| Flag Bits | Description |
|---|---|
| 31 | ACK flag, used when user data needs to be transferred in multiple frames. From the point of view of the IED, the first frame does not set the ACK flag, however, subsequent frames transferred with user data will need the ACK flag set. From the point of view of a message receiver, i.e., PC 512, a request command will have the ACK flag set to the IED. |
| 30 | Last user data transfer. Set by the sender in the last user data transfer frame. |
| 29 | Indicates a file or directory command code (e.g., 34, 35, 36, 0 = file, 1 = directory. |

I.2—"User Command Code" Holding Register

Figure 6:
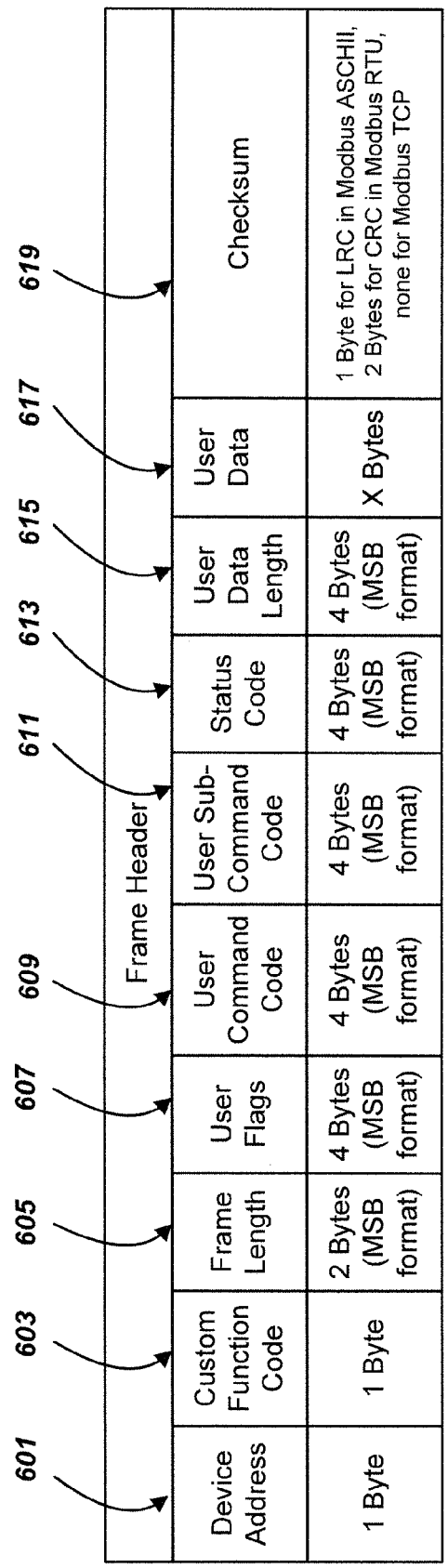
FIG. 6 is a table illustrating various user command codes in accordance with the present disclosure.
Figure 7A:
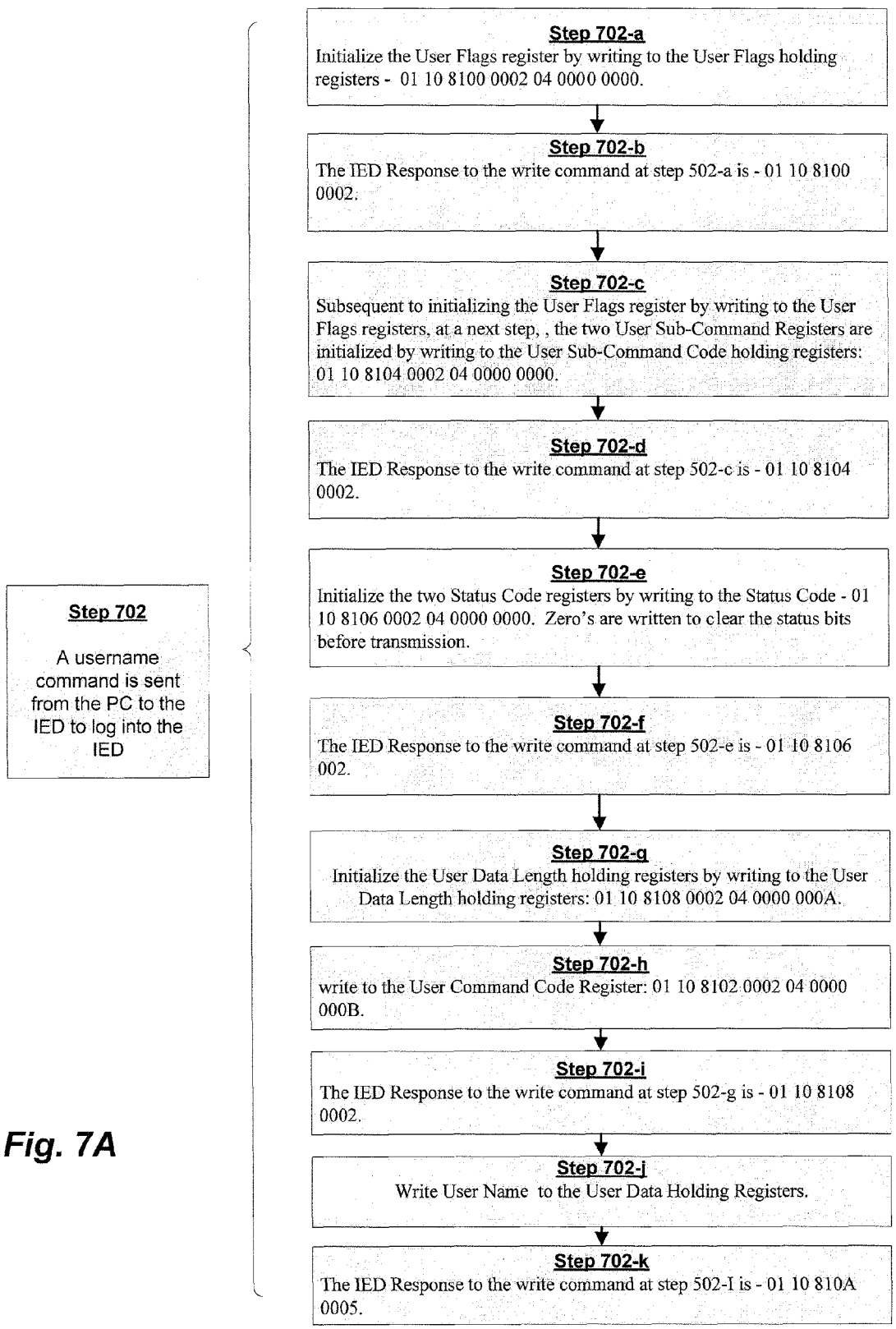
FIGS. 7A-7H are an operational flow diagram providing a functional overview for downloading log data in accordance with the present disclosure.
Figure 7B:
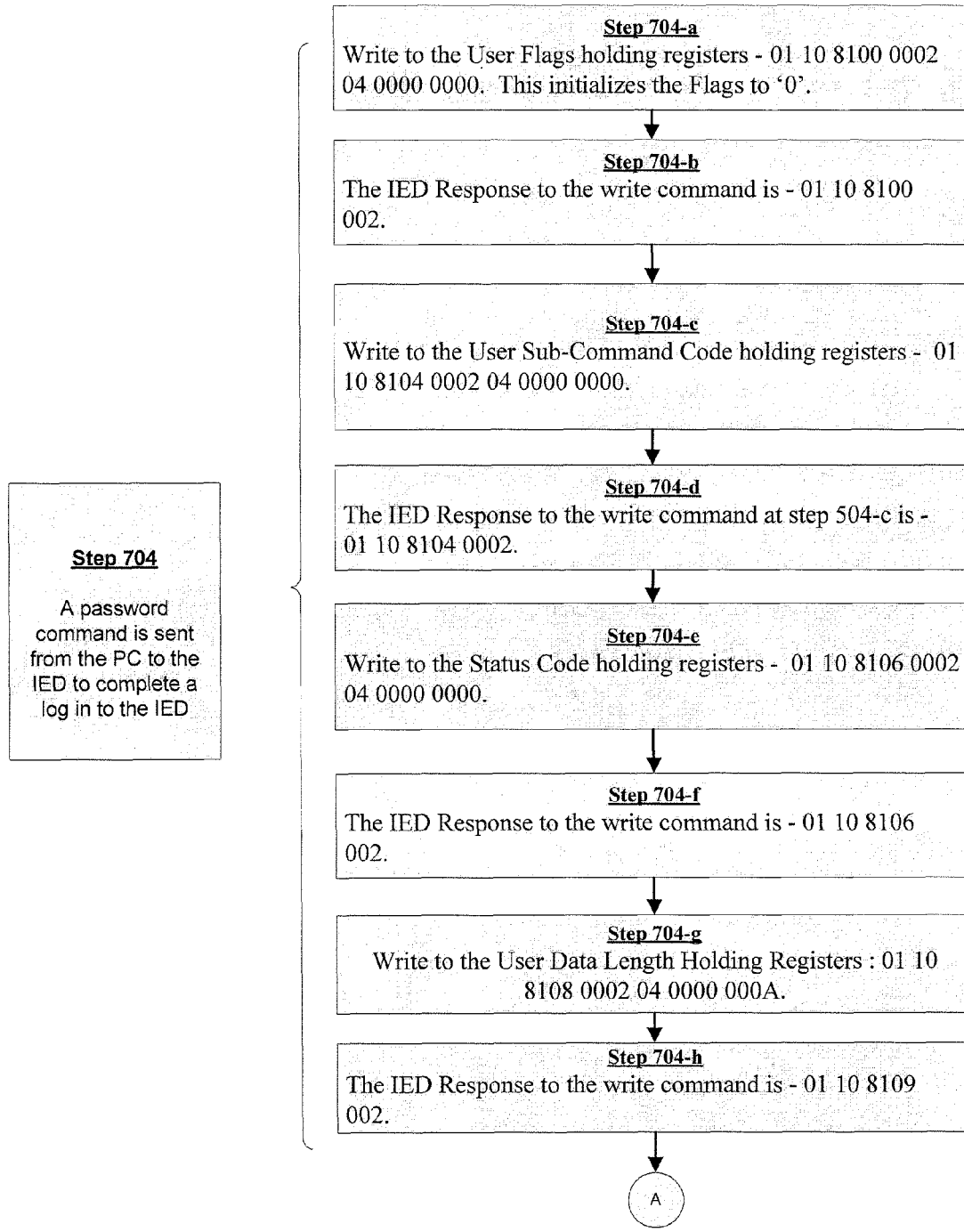
Figure 7C:
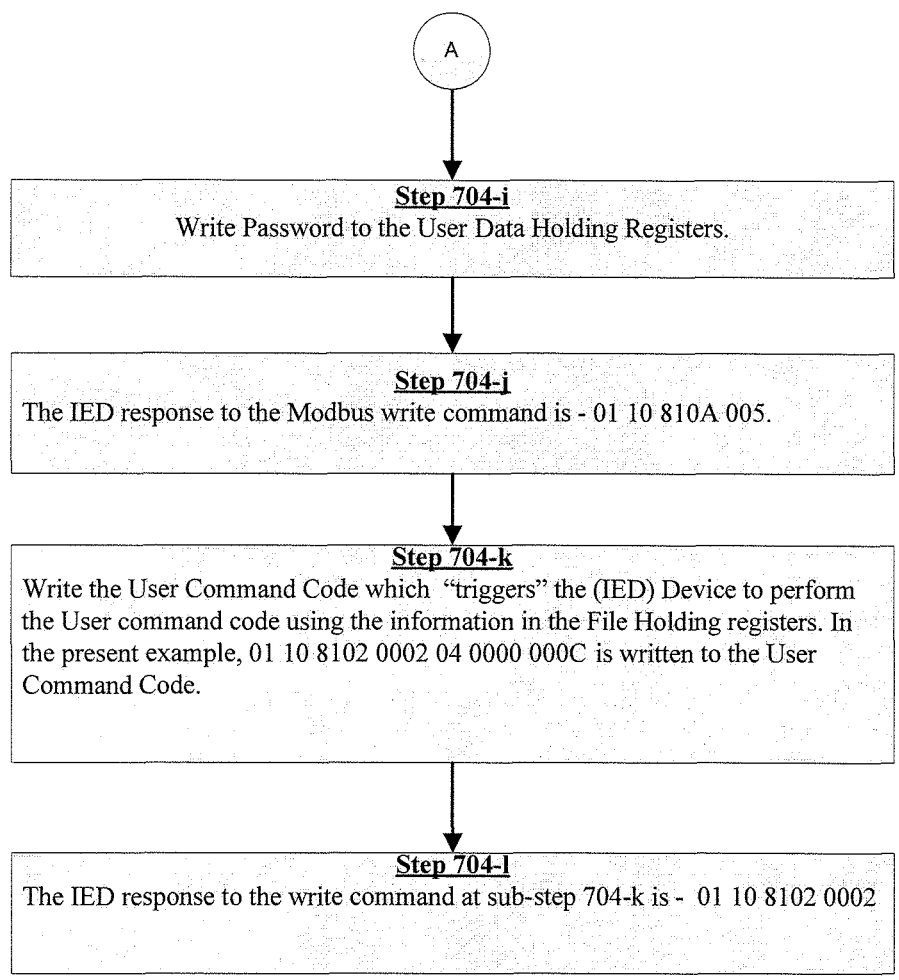
Figure 7D:
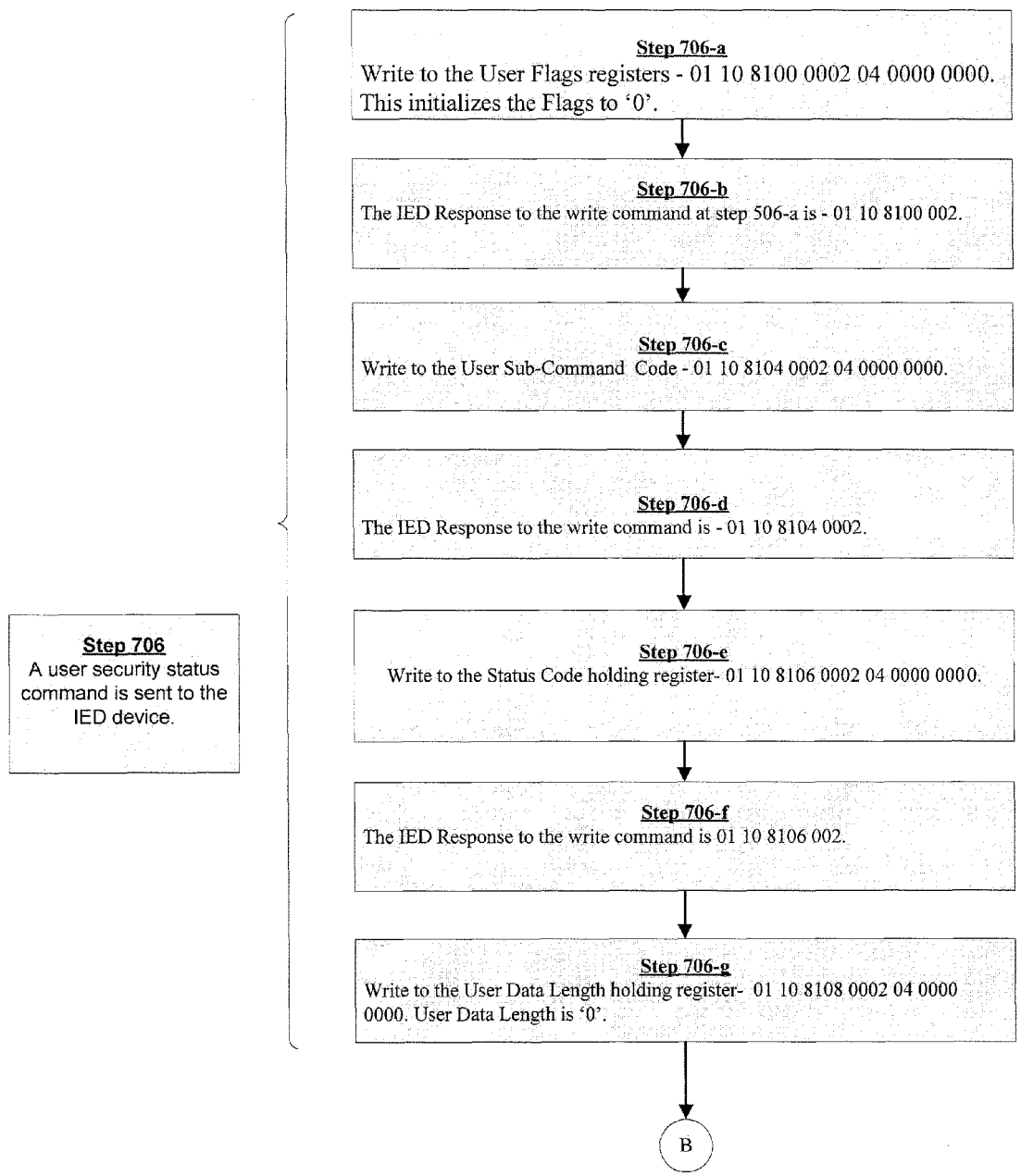
Figure 7E:
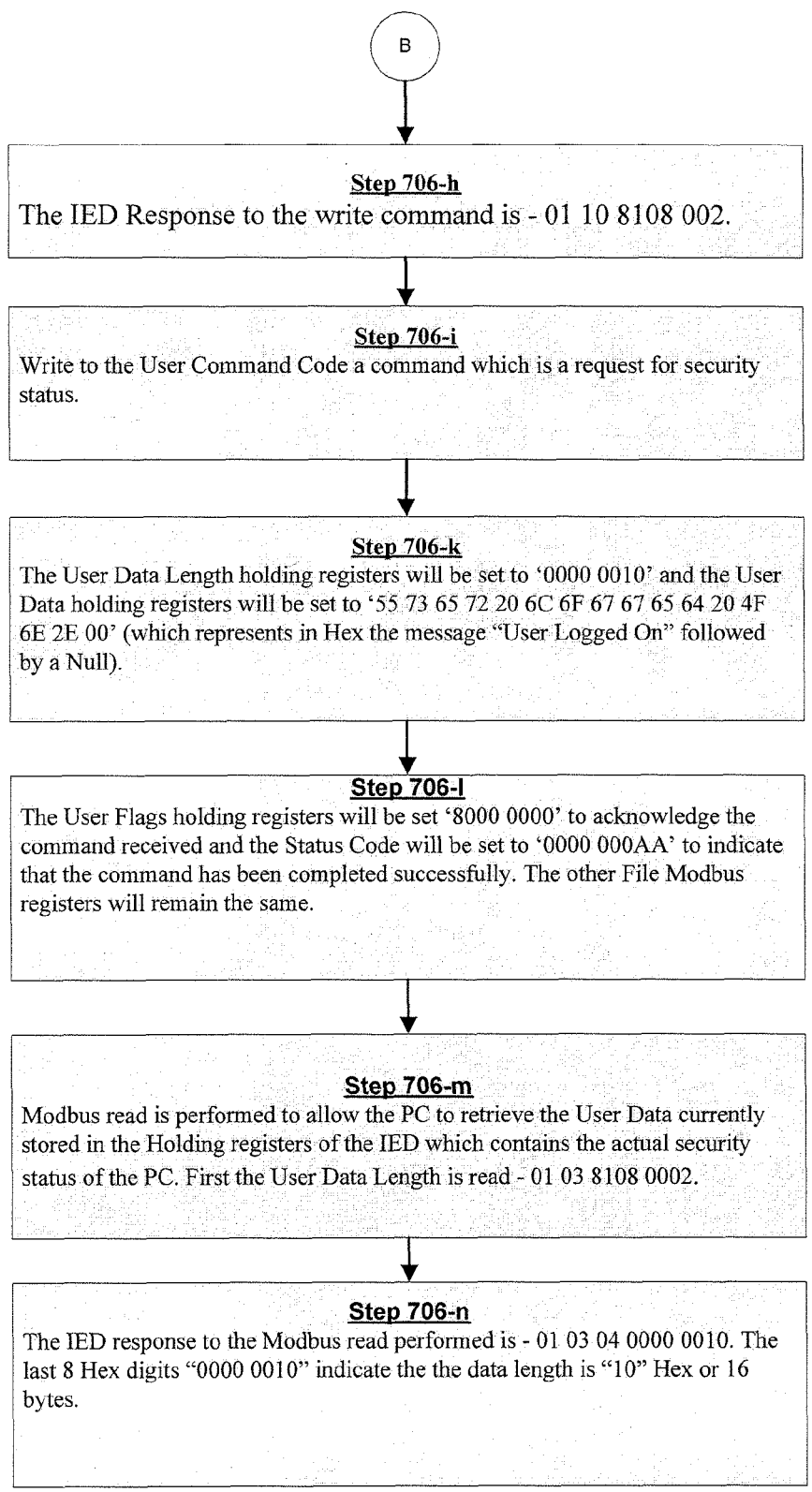
Figure 7F:
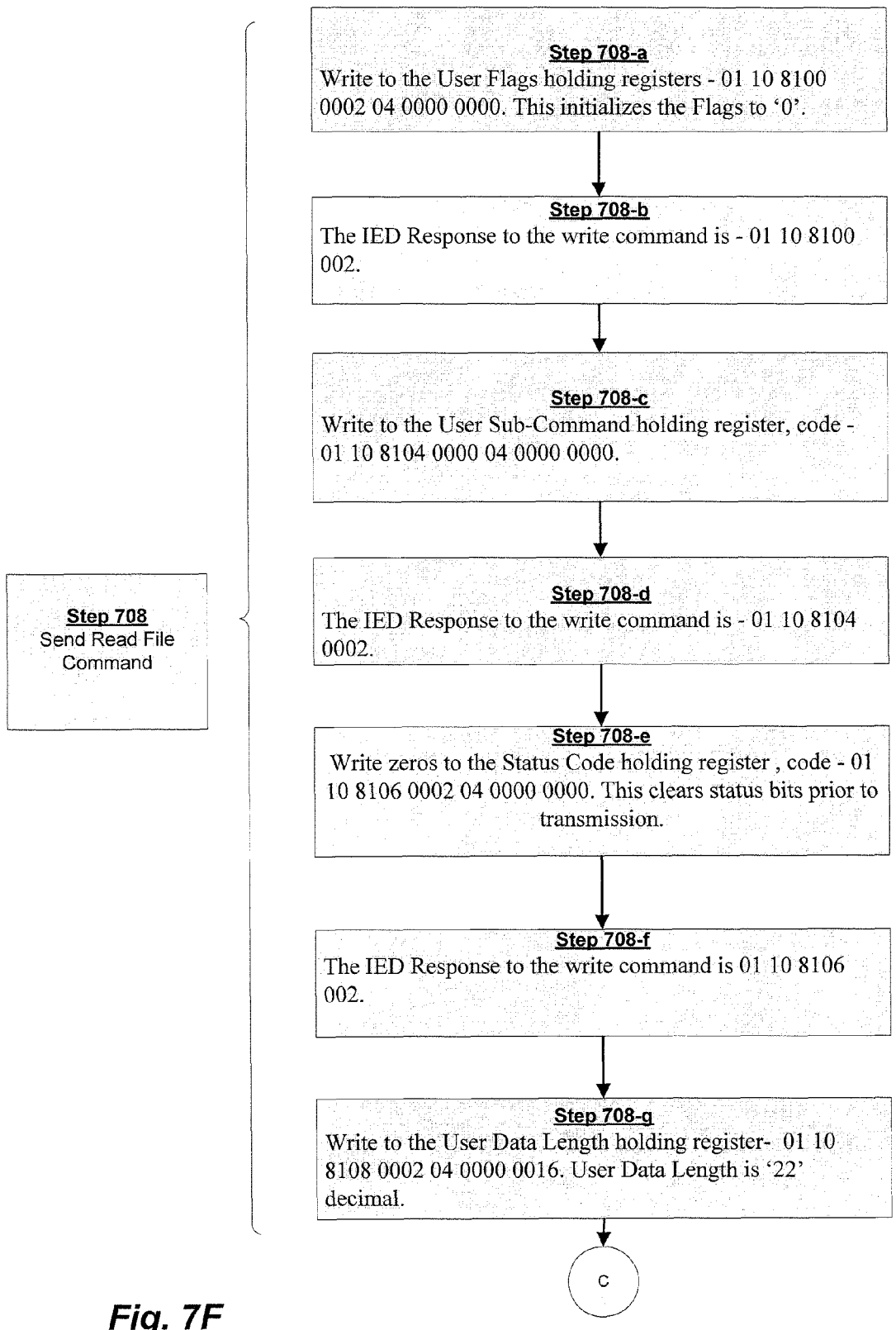
Figure 7G:
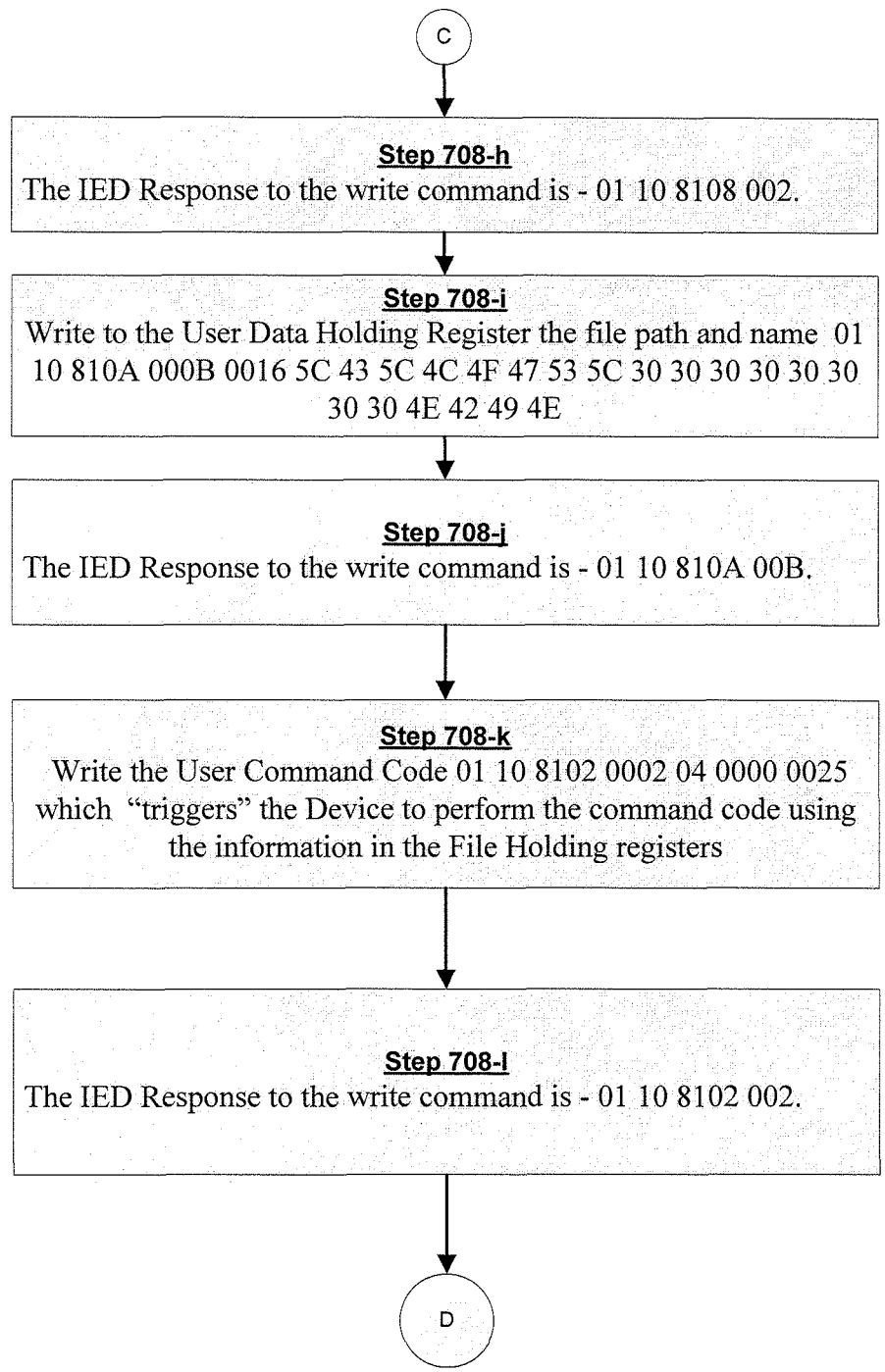
Figure 7H:
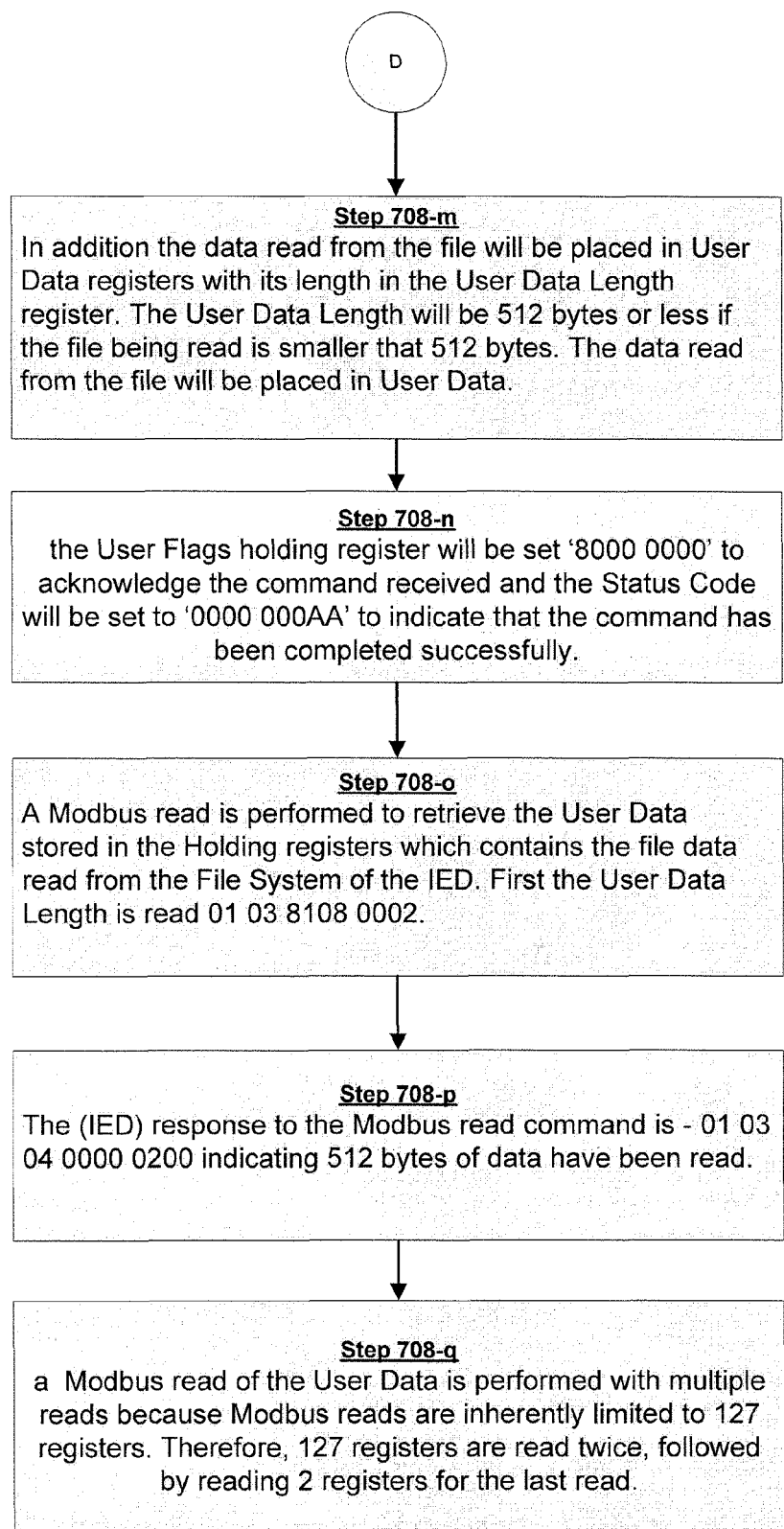

The "User Command Code" holding register is a four-byte register and is used to store a primary user defined command code. It should be understood that command codes can be grouped at the choice of the developer. FIG. 6 is a table illustrating various user command codes. As shown in Table III above, Command Codes 34-36 are directed to file or directory commands. As such, whenever these command codes are implemented in the Modbus message, the "User Flag" holding register must be set to 29 as shown in Table III above (for the example example implementation).

I.3—"User Sub-Command Code" Holding Register

The "User Sub-Command Code" holding register is a four-byte register and is used in those cases where a data transfer is sent in a multi-framed process. In these cases, a sequence number is used in the "User Sub-Command Code" register. The sequence number for a first frame in a multi-frame transfer is zero and is sequentially incremented for subsequent frames.

I.4—"Status Code" Holding Register

The "Status Code" holding register is a four-byte register and is set by the receiving end of a data transfer. It is noted that a user should always check the status code when processing a response message. For example, if after a Modbus File system command was sent, the IED modified the Status Code register to "00AA" it would indicate that the command had completed successfully. If the IED modified the Status Code register to "00FA", it would indicate that the command had "Failed" and was not executed by the IED.)

I.5—The "User Data Length" Holding Register

The "User Data Length" holding register is a four-byte register and stores the user length of a transmitted frame. In one implementation, the user data length is restricted to 512 bytes to conserve Holding register resources.

I.6—The "User Data" Holding Register

The User Data Holding Register contains data that is being sent to the IED or data that is being returned from the IED. There is no restriction on the nature of the data to be sent/received, however, the data is typically file related. As one non-limiting example, a type of data that could be sent to the IED would be data related to the updating of firmware. In this case, a file is transmitted to the IED with a firmware update in the User Data Holding Register. Because the holding registers are of a fixed size, it may be required to send the data (e.g., firmware update data) in multiple transmission where each transmission includes a block of data, for example, from the firmware file. In other words, multiple write commands are required to complete the transmission of all of the data. Similarly, when downloading logs from the IED, the User Data Holding Register contains a block of data from the log file which is transferred through multiple read commands. The data in the User Data Holding Register being transmitted from the IED may also contain file information or directory information such as a directory listing, etc., that is data related to file system operation and status.

First Embodiment

In operation, once a user has set up the necessary information in the respective holding registers, such as those shown by way of example in Table II above, at a next step, the user clears out the "User Flags" by writing 0x0000 to two User Flag holding registers (not shown). Next, the user writes an appropriate command code to the "User Command Code" register to perform an operation which acts on the data that has been previously set up in the holding registers. The operation can be any conventional Modbus operation, such as, for example, "Username" command or "Password" command or "File Read" command and so on. It is noted that these user operations are performed by an external device (e.g., PC) for receiving a file data transfer from the holding registers of the IED to the PC or otherwise for operations going from the PC to the IED.

One common example of a file data transfer from PC to IED is when it is necessary to update the firmware in the IED, the update file has to be sent from the PC to the IED. One common example of a file data transfer from IED to PC is the downloading of log data files from the IED.

In the case where a file data transfer is requested from the PC for IED log data, when the user receives a "00AA" Status Code at the PC in response to a requested file read command, it indicates that a File Read command has been performed and completely successfully and the file data has been transferred to the User Data Holding registers of the IED. It should be noted that at this stage, the file data transfer is not complete. That is, the file data must now be downloaded from the holding registers of the IED to the PC. To achieve this, the user can perform a number of Modbus reads of the "User Data" registers to actually retrieve the file data from the Holding registers of the IED. These operations are shown as follows by way of example and not limitation.

It is noted that all of the commands described in the presently described embodiment are standard Modbus commands. Further, for Modbus Writes the standard write multiple registers function code 10 is used and for Modbus Reads the standard read function code 03 is used, which is defined in the Modbus specification, i.e., Modbus Application Protocol Specification V1.1 b, incorporated by reference herein in its entirety.

Example

In the instant example, a process is described for executing a data transfer from a File System of the IED to an external device such as a PC, according to the presently described embodiment.

FIGS. 7A-7H (collectively referred to herein as FIG. 7) are a flowchart illustrating, at both a top level and a detailed level, a process for effecting a data transfer from a File System of the IED to an external device, such as a PC, according to the presently described embodiment. This process is generally described at a top level by steps 702-708 of the flowchart of FIG. 7.

At a top level, to execute a data transfer from the File System of the IED to the PC, dedicated Modbus Holding Registers are set up inside of the IED by the external device (e.g., PC). Once the Modbus Holding Registers have been set up inside of the IED, they are then directly referenced by a User Command (e.g., Send Read File command) initiated by the PC. Upon being initiated by the PC in the User Command, a data transfer is executed from the IED's File System to respective Holding Registers of the IED. Once the data has been transferred from the File System to the IED Holding registers, it can be accessed by the PC via Modbus Read commands. The top level description, as defined by steps 702-708, describe four sequential actions for implementing the set-up stage and the execution stage, as described above. These general steps include: (I) Step 702—sending a username command from the PC to the IED to log into the IED, followed by (II) Step 704—sending a password command from the PC to the IED to complete the login procedure, (III) Step 706—a user security status command is returned from the (IED) device, (IV) Step 708—a Send Read File command is issued from the PC with '\C\LOGS\00000000.BIN'. in the user data field as the file name.

A description of the general process flow for implementing the set-up stage and execution stage, as discussed above, are now described in greater detail.

Step 702—Send Username Command from PC to the IED to Login PC to the IED.

At top level step 702, a username command is sent from the PC to the IED to log into the IED. This step comprises number sub-steps 702-a through 702-k, described as follows.

It is assumed in this example that the user name has 9 characters. It is assumed in this example that the user name is "anonymous" which has 9 characters. The hexadecimal conversion of "anonymous" used when performing Modbus RTU commands is "61 6E 6F 6E 79 6D 6F 75 73".

At sub-step 702-a, Initialize the User Flags register by writing to the User Flags registers—01 10 8100 0002 04 0000 0000.

At sub-step 702-b, the (IED) response to the write command at sub-step 502-a is—01 10 8100 0002.

Table IV illustrates, by way of example, a conventional Modbus command for writing to the User Flag holding registers of the IED. As is well known, a conventional Modbus command is issued from an external device (e.g., PC) as a Master Packet having the following format.

TABLE IV

| Master Packet issued from PC | |
| --- | --- |
| Slave Address | 01H |
| Function Code | 10H |
| Data Starting addresss - Hi | 81H |
| Data Starting address - Lo | 00H |
| Number of Setpoints - Hi | 00H |
| Number of Setpoints - Lo | 02H |
| Byte Count | 04H |
| Data #1 - Hi | 00H |
| Data #1 - Lo | 00H |
| Data #2 - Hi | 00H |
| Data #2 - Lo | 00H |
| CRC - Lo | 9FH |
| CRC - HI | F9H |

As is well known, in accordance with the Modbus Protocol, the IED replies to the command for initializing the User Flags register with a conventional Modbus reply, by issuing a reply Slave Packet response, having the format shown in Table V.

TABLE V

| Slave Packet Response from IED | |
| --- | --- |
| Slave Address | 01H |
| Function Code | 10H |
| Data Starting addresss - Hi | 81H |
| Data Starting address - Lo | 00H |
| Number of Setpoints - Hi | 00H |
| Number of Setpoints - Lo | 02H |
| CRC - Lo | 69H |
| CRC - HI | F4H |

It is noted that each of the command/response pairs to be described as follows will have a master/slave packet format similar to that shown above in Tables IV and V, respectively. For ease of explanation, however, these table structures will not be shown. However, the form and function of these table structures should be readily apparent to those knowledgeable in the communication arts in general and with the Modbus protocol in particular.

Continuing with the present example for effecting a data transfer from a File System of the IED from an external device such as a PC:

At sub-step 702-c, subsequent to initializing the User Flags register by writing to the User Flags registers, at a next sub-step, the two User Sub-Command Registers are initialized by writing to the User Sub-Command Code holding registers: 01 10 8104 0002 04 0000 0000.

At sub-step 702-d, the (IED) response to the write command at sub-step 502-c is—01 10 8104 0002

At sub-step 702-e, initialize the two Status Code registers by writing to the Status Code—01 10 8106 0002 04 0000 0000. Zero's are written to clear the status bits before transmission.

At sub-step 702-f, the (IED) response to the write command at step 502-e is—01 10 8106 002.

At sub-step 702-g, initialize the User Data Length holding registers by writing to the User Data Length holding registers: 01 10 8108 0002 04 0000 000A. It is noted that the User Data Length has to be an even number since all writes have an even number of bytes when using multiple register write which is function code 10.

At sub-step 702-h, write to the User Command Code Register: 01 10 8102 0002 04 0000 000B. Where 01 is the slave device, 10 is the function code for multiple register writes, 8102 is the starting address for the User Command Code in the Modbus map, 0002 is the number of registers to be written to, 04 is the byte count of the registers being written, and 0000 000B is the command code for the User Name Command. When the IED receives the User Command Code written to the User Command Code registers it causes the IED to perform the command in the User Command Code registers which for the above example is to perform the User Name command. In the instant example, the write command utilizes the previously set up Modbus registers in order to perform the command.

At sub-step 702-i, the (IED) response to the write command at step 502-g is—01 10 8108 0002.

At sub-step 702-j, write User Data to the User Data Holding Registers. It is noted that user data is 9 characters in the instant example. Each character requires a byte of data to represent it. This means that 5 registers are required in the Modbus write command which provides a capability of up to 10 bytes or up to 10 characters. The extra 10$^{th}$ character is set to '00' to indicate the end of the character string): 01 10 810A 0005 0A 61 6E 6F 6E 79 6D 6F 75 73 00 (where the "61 6E 6F 6E 79 6D 6F 75 73" is the user name "anonymous" in Hex).

At sub-step 702-k, the (IED) response to the write command at step 502-l is—01 10 810A 0005.

It is noted that in addition to the aforementioned recited steps, the IED also updates some of the Modbus Holding registers used for file system support. The Modbus Holding registers that will be updated are a function of the command being performed.

For example, in the present exemplary case the command being performed is a write to the User Command Code Register: 01 10 8102 0002 04 0000 000B. The (IED) response to the write is—01 10 8102 002.

The updates to the Modbus Holding Registers in response to the User Command include, (a) setting the User Flags register to '8000 0000' to acknowledge that a command has been received, (b) setting the Status Code to '0000 00AA' to indicate that the User Name Command was completed successfully. All other Modbus registers added for this embodiment will remain the same.

Step 704—Send Password Command from PC to the IED to Complete Login of the PC.

At top level step 704, a password command is sent from the PC to the IED to complete a log in to the IED. This step comprises sub-steps 704-a through 704-l, described as follows. In this example, it is assumed that the password comprises 9 characters, specifically "anonymous".

At sub-step 704-a, write to the User Flags holding registers—01 10 8100 0002 04 0000 0000. This initializes the Flags to '0'.

At sub-step 704-b, the (IED) response to the write command at sub-step 704-a is—01 10 8100 002.

At sub-step 704-c, write to the User Sub-Command Code holding registers—01 10 8104 0002 04 0000 0000.

At sub-step 704-d, the (IED) response to the write command at sub-step 704-c is—01 10 8104 0002.

At sub-step 704-e, write to the Status Code holding registers—01 10 8106 0002 04 0000 0000. Zero's are written to these holding registers to clear the status bits before transmission.

At sub-step 704-f, the (IED) response to the write command at sub-step 704-e is—01 10 8106 002.

At sub-step 704-g, write to the User Data Length Holding Registers: 01 10 8108 0002 04 0000 000A. It is noted that the value written to the User Data Length has to be an even number since all writes have an even number of bytes when using multiple register write which is function code 10. For a 9 character password as in our example where each character requires a byte of data the User Data Length will require 10 bytes.

At sub-step 704-h, the (IED) response to the write command at sub-step 704-g is—01 10 8109 002.

At Sub-Step 704-i, Write the User Data to the User Data Holding Registers.

In the present illustrative example, the password is arbitrarily chosen to be 9 characters. Each character requires a byte of data to represent it. This means that 5 registers are required in the Modbus write command which provides for 10 bytes or up to 10 characters. The extra 10$^{th}$ character is set to '00' to indicate the end of the character string): 01 10 810A 00050A 61 6E 6F 6E 79 6D 6F 75 73 00.

At sub-step 704-j, the IED response to the Modbus write command is—01 10 81 OA 005.

At sub-step 704-k, write the User Command Code which "triggers" the (IED) response to perform the User command code using the information in the File Holding registers. In the present example, 01 10 8102 0002 04 0000 000C is written to the User Command Code.

At sub-step 704-l, the IED response to the write command at sub-step 704-k is—01 10 8102 0002

It is noted that in addition to the aforementioned steps, the User Flags register will be set '8000 0000' to acknowledge the command received and the Status Code will be set to '0000 000AA' to indicate that the command has been completed successfully. The other Modbus holding registers listed in Table I will remain the same.

Step 706—Retrieve User Security Status Command from IED

With continued reference to the flowchart of FIG. 7, at top level step 706, a user security status command is sent to the (IED) so that the PC can verify whether it has successfully been logged on to the IED so that it can perform File commands. This step comprises steps 706-a through 706-k, described as follows.

At sub-step 706-a, write to the User Flags registers—01 10 8100 0002 04 0000 0000. This initializes the Flags to '0'.

At sub-step 706-b, the IED response to the write command at sub-step 706-a is—01 10 8100 002.

At sub-step 706-c, write to the User Sub-Command Code holding register—01 10 8104 0002 04 0000 0000.

At sub-step 706-d, the (IED) response to the write command at sub-step 706-c is—01 10 8104 0002.

At sub-step 706-e, write to the Status Code holding register—01 10 8106 0002 04 0000 0000. Zero's are written to clear the status bits before transmission of the User Command code which actually causes the IED to perform the command and update the Status Code.

At sub-step 706-f, the IED response to the write command at sub-step 706-e is 01 10 8106 002.

At sub-step 706-g, write to the User Data Length holding register—01 10 8108 0002 04 0000 0000. User Data Length is '0'.

At sub-step 706-h, the IED response to the write command at sub-step 706-g is—01 10 8108 002.

At sub-step 706-i, write to the User Command Code—01 10 8102 0002 04 0000 000A which "triggers" the IED response to perform the User command code using the currently stored information in the File Holding registers.

At sub-step 706-j, the IED response to the write command at sub-step 706-i is—01 10 8102 0002.

At sub-step 706-k, in addition to the aforementioned sub-steps, the User Data Length holding registers will be set to '0000 0010' and the User Data holding registers will be set to '55 73 65 72 20 6C 6F 67 67 65 64 20 4F 6E 2E 00' (which represents in Hex the message "User Logged On" followed by a Null). It is noted that the User Data must be an even number of bytes), At sub-step 706-l, The User Flags holding registers will be set '8000 0000' to acknowledge the command received and the Status Code will be set to '0000 000AA' to indicate that the command has been completed successfully. The other File Modbus registers will remain the same.

At sub-step 706-m, a Modbus read is performed to allow the PC to retrieve the User Data currently stored in the Holding registers of the IED which contains the actual security status of the PC. First the User Data Length is read—01 03 8108 0002.

At sub-step 706-n, the IED response to the Modbus read performed at sub-step 706-j is—01 03 04 0000 0010. The last 8 Hex digits "0000 0010" indicate the data length is "10" Hex or 16 bytes.

A Modbus read of the User Data is performed using the User Data Length retrieved in sub-step 706-k above. The User Data read comprises 01 03 810A 0008 (for 16 bytes of data is equal to 8 registers since each registers is 2 bytes). The Device (IED) is 01 03 10 55 73 65 72 20 6C 6F 67 67 65 64 20 4F 6E 2E 00. Note that "55 73 65 72 20 6C 6F 67 67 65 64 20 4F 6E 2E" that was returned by the IED as the security status represents "User logged On.".

Step 708—Send Read File Command from PC to the IED

With continued reference to the flowchart of FIG. 7, at top level step 708, a Send Read File command is issued from the PC with '\C\LOGS\00000000.BIN' in the user data field. This sub-step comprises sub-sub-steps 708a-708-p, described as follows.

At sub-step 708-a, write to the User Flags holding registers—01 10 8100 0002 04 0000 0000. This initializes Flags to '0'.

At sub-step 708-b, the (IED) response to the write command at sub-step 708-a is—01 10 8100 002.

At sub-step 708-c, write to the User Sub-Command Code holding register—01 10 8104 0002 04 0000 0000.

At sub-step 708-*d*, the (IED) response to the write command at sub-step 708-*c* is 01 10 8104 0002.

At sub-step 708-*e*, write to the Status Code holding registers—01 10 8106 0002 04 0000 0000. Zero's are written to clear the status bits before transmission of the User Command code which actually causes the Device to perform the command and update the Status Code.

At sub-step 708-*f*, the (IED) response to the write command at sub-step 708-*e* is 01 10 8106 002.

At sub-step 708-*g*, write to the User Data Length holding registers—01 10 8108 0002 04 0000 0016. The User Data Length is 22 bytes.

At sub-step 708-*h*, the (IED) response to the write command at sub-step 708-*g* is—01 10 8108 002.

At sub-step 708-*i*, write to the User Data holding registers the file path and name—01 10 810A 000B 0016 5C 43 5C 4C 4F 47 53 5C 30 30 30 30 30 30 30 30 4E 42 49 4E 20 00. Note that Hex sequence "5C 43 5C 4C 4F 47 53 5C 30 30 30 30 30 30 30 30 4E 42 49 4E 20" in the Modbus command represents "\C\ LOGS\00000000NBIN".

At sub-step 708-*j*, the (IED) response to the write command at sub-step 708-*i* is—01 10 810A 000B.

At sub-step 708-*k*, write to the User Command Code—01 10 8102 0002 04 0000 0025 which "triggers" the (IED) Device to perform the command code using the currently stored information in the File Holding registers.

At sub-step 708-*l*—The IED Response is: 01 10 8102 0002.

At sub-step 708-*m*—In addition the data read from the file will be placed in User Data registers with its length in the User Data Length register. The User Data Length will be 512 bytes which is the maximum size User Data registers can hold in this example or less if the file being read is smaller that 512 bytes. The data read from the file will be placed in User Data.

At sub-step 708-*n*, the User Flags holding register will be set '8000 0000' to acknowledge the command received and the Status Code will be set to '0000 000AA' to indicate that the command has been completed successfully.

At sub-step 708-*o*, a Modbus read is performed to retrieve the file data previously read from the File System of the IED and is currently stored in the User Data Holding registers. Prior to doing the Modbus read, the User Data Length is read 01 03 8108 0002.

At sub-step 708-*p*, the (IED) response to the Modbus read command performed at sub-step 708-*p* is—01 03 04 0000 0200 indicating 512 bytes of data have been read.

At sub-step 708-*q*, a Modbus read of the User Data is performed with multiple reads because Modbus reads are inherently limited to 127 registers. Therefore, 127 registers are read twice, followed by reading 2 registers for the last read. The sequence will be:

A. Modbus read of first 127 registers: 01 03 810A 007F. Device (IED) 01 03 FE xxxx . . . to 254 bytes of data.
B. Modbus read of Second 127 registers: 01 03 8189 007F. Device (IED) 01 03 FE xxxx . . . to 254 bytes of data.
C. Modbus read of last 2 registers: 01 03 8208 0002. Device (IED) 01 03 04 xxxx xxxx (4 bytes of data).

Second Embodiment

In one embodiment, customized function codes implement a set of commands which support a large embedded file system and provide for high speed, efficient data transfers which are of great benefit when retrieving large log files, for example from an internal IED file structure. The customized function codes effectively extend the Modbus protocol. By extending the Modbus protocol using custom function codes, in a manner to be described below, the enhanced implementation is still compatible with the existing infrastructure because the custom function codes need not be used by legacy devices and are transparent to them so that a mixed architecture of enhanced and standard Modbus devices can be easily integrated. In the presently described embodiment, a single custom Function code is used that provides a capability for maximizing the size of data transfers in a single read command without limitation. Additionally, the custom Function code desirably does not utilize any additional Modbus resources. In other words, all extensions for the addition of File systems capability are implemented using a single custom Function code which uses none of the Modbus Holding or Input Registers because the all results are embedded in the actual custom Function code to be described below. In addition because the Modbus Holding register map has not been modified the implementation described in the present embodiment is fully compatible with legacy implementations, such as those described above.

FIG. 6 is an illustration of an exemplary base Modbus message format for large data access using the Modbus Protocol, in accordance with the presently described embodiment. The base Modbus message is comprised of 10 fields, a "Device Address" field 601, a "Custom Function Code" field 603, a "Frame Length" field 605, a "User Flags" field 607, a "User Command Code" field 609, a "User Sub-Command Code" field 611, a "Status Code" field 613, a "User Data Length" field 615, a "User Data" field 617 and a "Checksum" field 619.

Each field is now described as follows.

Device Address Field 601

The "Device Address" field 601 is a one-byte field and corresponds to the device being addressed by the base Modbus message. For example, the "Device Address" field 601 could have a value of __(01).

Custom Function Code Field 603

The "Custom Function Code" field 603 is a one-byte field and corresponds to a particular custom function code for identifying the base Modbus message. In one embodiment, a custom function code of 0x45 hex (69 dec) was selected for identifying a custom read command.

Frame Length Field 605

The "Frame Length" field 605 is a two-byte field and corresponds to the length of the Modbus message. That is, this field is an integer sum of the length of each field in the base Modbus message. Table VI provides a representative example of how this field is derived. In the case where the Modbus message comprises a frame length of 24, the constituent fields that make up this frame length comprise, for example:

TABLE VI

| Fields of a Modbus Message | |
|---|---|
| Device Address | 1 byte |
| Custom Function Code | 1 byte |
| Frame Length | 2 byte |

TABLE VI-continued

Fields of a Modbus Message

| | |
|---|---|
| User Flags | 4 byte |
| User Command Code | 4 byte |
| User Sub-Command Code | 4 byte |
| Status Code | 4 byte |
| User Data Length | 4 byte |
| User Data | X byte (where X is the number of bytes specified in the User Data Length field above. If the User Data Length field is set to 0 then the message will not contain the User Data field so that the total message size in that case is the minimum message size that can be sent is 1 + 1 + 2 + 4 + 4 + 4 + 4 + 4. Note that the checksum field = 0 bytes for this byte count which is assumes that the Modbus message is Modbus TCP). |
| Checksum | 0 bytes, 1 byte or 2 bytes |

User Flag Field 607

The "User Flag" field 607 is a four-byte field and comprises particular user codes for providing supplemental information in the case of transferring data in multiple frames or indicating a last or final user data transfer or indicating a file or directory command is being executed. Table VII further describes this supplemental information.

TABLE VII

Supplemental Information

| Flag Bits | Description |
|---|---|
| 31 | ACK flag, used when user data needs to be transferred in multiple frames. From the point of view of the IED, the first frame does not set the ACK flag, however, subsequent frames transferred with user data will need the ACK flag set. From the point of view of a message receiver, i.e., PC 12, a request command will have the ACK flag set to the IED. |
| 30 | Last user data transfer. Set by the sender in the last user data transfer frame. |
| 29 | Indicates a file or directory command code (e.g., 34, 35, 26, 0 = file, 1 = directory. |

User Command Code Field 609

The "User Command Code" 609 field is a four-byte field and comprises a primary user defined command code. It should be understood that command codes can be grouped at the choice of the developer. Whenever a file or directory command is utilized in the Modbus message, the "User Flag" field 607 must be set to 29.

User Sub-Command Code Field 611

The "User Sub-Command Code" field 611 is a four-byte field and is used in those cases where data is sent in a multi-framed process. In these cases, a sequence number is used in the "User Sub-Command Code" field 611. The sequence number for a first frame in a multi-frame transfer is zero and is sequentially incremented for subsequent frames.

Status Code Field 613

The "Status Code" field 613 is a four-byte field and is set by the receiving end of a data transfer. It is noted that a user should always check the status code when processing a response message. FIG. 8 is a table illustrating typical user status codes. For example if after a Modbus File system command was sent the IED responded with the Status Code field 513 set to "00FA" it would indicate that the command had "Failed" and was not executed by the IED)

User Data Length Field 615

The "User Data Length" field 615 is a four-byte field and is set to the user length of a transmitted frame. In one implementation, the user data length is restricted to 1408 bytes (64*22). This is to maximize performance on high bandwidth interfaces, such as Ethernet while maintaining a reasonable data length for slower legacy interfaces. The size of a Modbus message is designed to fit into a single Ethernet frame (e.g., 1408 bytes) so that optimum efficiency is achieved when transferring Modbus TCP messages over Ethernet. As is well known, TCP/IP does not fragment the Modbus messages into multiple TCP packets to be restored again at the receiving end. Therefore, to maintain native compatibility with the basic frame size of Ethernet the maximum size of Modbus messages should be 1408 bytes or smaller.

By tailoring Modbus messages to the Ethernet frame size, an almost equivalent performance can be achieved with very large transfers. This is due to the overhead incurred by the TCP/IP stack in fitting and recovering large blocks of data when transmitting and receiving the large blocks using the limited packets size inherent as part of the Ethernet interface.

Further, the limited message size of 1408 bytes, while being very efficient for Modbus, is also ideal for legacy serial interfaces. This occurs because even though the size of each transfer is increased five fold, the block of data being transferred is relatively small allowing for robust error detection. In the case of an error, only a small block of 1408 bytes need be retransmitted and recovery is rapid. If very large data blocks such as 65536 byes (32768 registers as discussed above) were used, the probability of an error from noise is greatly increased, thereby forcing a retransmission of a data block that is 45 times greater then when using 1408 data blocks so that the user incurs a much greater performance penalty when a retransmission occurs.

User Data Field 617

The "User Data" field 617 is a field that contains the user specific data, whenever it is included in the message. In those cases where there is no user data, this field is not included in the Modbus message. For multi-framed data transfers, a user must send the data in a fixed length window except for the last frame. For example, a preferred multi-data transfer field length is 4096 bytes to comply with the Ethernet standard, as described above. In this case, a preferred transfer window size is 1048 bytes, requiring the transmission of three frames, where each frame transmits 1408, 1408 and 1280 bytes, respectively.

Checksum Field 619

The "Checksum" field 619 contains a checksum for this Modbus message. The field length is one-byte for LRC in Modbus ASCII, two-bytes for CRC in Modbus RTU and no bytes for Modbus TCP.

Example

In the instant example, it is desired to effect a data transfer from a File System of the IED from an external device such as a PC, according to the presently described embodiment. A custom function code is transmitted from an external device such as a PC to the IED via Modbus RTU. It should be appreciated that Modbus RTU is described here by way of example and not limitation and other transport protocols may be used. For ease of explanation, no checksum is shown in the following example. All values are shown in Hex format by way of example only.

First, a "Send Username" command (i.e., function code 45) is issued from the PC to the IED, utilizing a custom function code, illustrated as follows. This example assumes that the username is comprised of nine characters.

A "Send Username" command is sent from the PC to the IED using the following custom function code format.

| Device Address | Custom Function Code | Frame Length | User Flags | User Command Code | User Sub-Command Code | Status Code | User Data Length | User Data | Chk sum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 0018 | 0000 0000 | 0000 000B | 0000 0000 | 0000 0000 | 0000 0009 | 9 bytes | |

The (IED)response from the IED to the PC is:

| Device Address | Custom Function Code | Frame Length | User Flags | User Command Code | User Sub-Command Code | Status Code | User Data Length | User Data | Checksum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 0018 | 8000 0000 | 0000 000B | 0000 0000 | 0000 00AA | 0000 0000 | 0 bytes | |

It is noted that User Flags '8000 0000' indicates that an acknowledgment (ACK) that the Device (IED) received the "Send Username" command from the PC. Also, Status Code '0000 00AA' indicates that the command was completed successfully Next, the PC sends a password command having 9 characters to log into the Device (IED).

| Device Address | Custom Function Code | Frame Length | User Flags | User Command Code | User Sub-Command Code | Status Code | User Data Length | User Data | Check sum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 0021 | 0000 0000 | 0000 000C | 0000 0000 | 0000 0000 | 0000 0009 | 9 bytes | |

The (IED) response from the IED to the PC is:

| Device Address | Custom Function Code | Frame Length | User Flags | User Command Code | User Sub-Command Code | Status Code | User Data Length | User Data | Check Sum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 0018 | 8000 0000 | 0000 000C | 0000 0000 | 0000 00AA | 0000 0000 | 0 bytes | |

It is noted that User Flags '8000 0000' indicates that an acknowledgment (ACK) that the Device (IED) received the "Password" command from the PC. Also, Status Code '0000 00AA' indicates that the command was completed successfully.

Next, the PC sends a "Security Status" command to the Device (IED).

| Device Address | Custom Function Code | Frame Length | User Flags | User Command Code | User Sub-Command Code | Status Code | User Data Length | User Data | Check sum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 0018 | 0000 0000 | 0000 000A | 0000 0000 | 0000 0000 | 0000 0000 | 0 bytes | |

The (IED) response to the "Security Status" command issued from the PC is:

| Device Address | Custom Function Code | Frame Length | User Flags | User Command Code | User Sub-Command Code | Status Code | User Data Length | User Data | Check sum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 0027 | 8000 0000 | 0000 000A | 0000 0000 | 0000 0109 | 0000 000F | See par. below | |

User Data comprises: 55 73 65 72 20 6C 6F 67 67 65 64 20 4F 6E 2E (which represents in Hex the message "User Logged On")

Next, the PC sends a "Read File" command with '\C\LOGS\00000000.BIN' in user data field

| Device Address | Custom Function Code | Frame Length | User Flags | User Command Code | User Sub-Command Code | Status Code | User Data Length | User Data | Check sum |
|---|---|---|---|---|---|---|---|---|---|
| 1 byte | 1 byte | 2 bytes | 4 bytes | 4 bytes | 4 bytes | 4 bytes | 4 bytes | X bytes | |
| 01 | 45 | 002D | 0000 0000 | 0000 0025 | 0000 0000 | 0000 0000 | 0000 0015 | See par. below | |

User Data comprises: 5C 43 5C 4C 4F 47 53 5C 30 30 30 30 30 30 30 30 4E 42 49 4E 20

Virtual FTP Commands for Extending the Functionality of File-Centric Protocols

Most communication protocols transfer information using formats and structures specific to the protocol, usually in the form of requests and responses, either for the purpose of information transfer or in order to initiate actions. For example, some protocols like FTP and HTTP are file-centric in that they operate on objects with a near-universal identification structure consisting of one or more of: a drive or host address, one or more nested directory names, and a filename, with the operations encompassing at a minimum, a read/get/copy-from method, as well as others like create/write/put, rename or delete. Other protocols, like Modbus, are not file-centric and do not directly support file system operations as in file-centric protocols. Instead, non-file-centric protocols utilize other, mutually incompatible, if not completely unique constructions for grouping, segregating, enumerating and identifying actions, objects or parameters.

Unlike the file-centric protocols, these non-centric file protocols, like Modbus, operate on registers instead of files. A register being a 2 byte quantity capable of conveying 65,536 different values. A typical Modbus command is mainly comprised of a Device Address field, a Function Code field, Register addresses, Register Counts, Byte Counts and Register values.

It is important to have access to both non-file centric protocol or other based protocol assignment and files transfer protocol structure when trying to retrieve information from an IED for presentation because the retrieval of information from the IED for presentation typically requires, in addition to retrieving a file or files, the retrieval of additional information from the IED that is not accessible via only file system commands. This additional information requires a non-file centric protocol (i.e., a command/response protocol) such as the Modbus protocol to retrieve the additional information for purposes of file identification of files of interest and the location of records of interest.

According to one aspect of the present application, it is contemplated to create virtual commands which extend the functionality of any file-centric protocols to support commands and functions not normally supported by file centric protocols, thereby overcoming the afore-mentioned drawback of requiring the use of two different protocols.

In one exemplary embodiment, a virtual FTP command, which is a type of virtual command, includes as part of the virtual command's path and filename, various parts of a Modbus request. When the FTP virtual command is parsed by the IED, the various parts of the Modbus request are acted on to provide access to the Modbus Map via a standard file interface, such as FTP.

Three approaches are described for implementation within the IED by extending the functionality of FTP without modifying the FTP protocol itself. All three approaches can be supported concurrently in the IED. The virtual commands to be described advantageously conform to a high-speed transfer protocol such as the FTP protocol and consequently take advantage of its inherent performance advantages. The advantages include, for example, quicker retrieval of Logs, including log headers and configuration. Further, as stated above, the virtual commands extend the functionality of any file-centric protocols to support commands and functions not normally supported by file centric protocols, thereby overcoming the afore-mentioned drawback of requiring the use of two different protocols.

As described above, virtual file commands are commands that are packaged as the names or data of files being accessed (e.g., FTP files), and can be used to readily implement new functionality into an IED, while still using an existing communications media (such as FTP). In operation, when a virtual command is parsed by the IED, an event is raised to the firmware's file system handler, which recognizes the file as a virtual command. An event is then raised to other parts of the internal file system to execute the command specified in the virtual command.

According to one embodiment, a virtual FTP file command is used which includes, as part of the FTP file command, the name of a file being accessed in the IED. However, unlike a conventional command, it should be understood that the IED interprets the file name in a non-conventional way. That is, the IED parses the virtual FTP file command and interprets the file name in the virtual FTP file command as a command. Actions are then taken as a function of the command with parameters possibly being extracted from the path and file name used. This file accessed does not have to actually exist in IED's file system.

Example

By way of example, a virtual FTP command is created as a Modbus Command with an FTP interface to request 5 registers from an IED at location '1234'. The virtual FTP command has the form of an FTP file read command to read the IED file:

FTP Virtual File Command: C:\Modbus\01\03\1234\0005\txt.

In accordance with this example, the Modbus command, "010312340005", which is included as part of the path name of the FTP Virtual File Command is interpreted in the IED as a Modbus command with a Device Address 01, Function Code 03 (which is a Read Register Command), Register Address 1234, Register Count 0005. This exemplary FTP virtual file command is a request for the 5 registers (10 bytes) from device 1 starting at address 1234 and continuing through address 1238.

It should be understood that, what appears on its face to be a conventional FTP file read command is actually a virtual FTP command for making a Modbus request in the guise of an FTP file request. The command structure of the FTP virtual file command acts as a carrier of the Modbus command. Unlike an ordinary file request, the virtual FTP file request is recognized by the File System of the IED as a special Modbus command because the path name C:\Modbus\ identifies it as a Modbus command. The IED responds to the FTP virtual file command by providing a Modbus response in a file. An example of a typical Modbus response was described above at sub-step 702-f of the flowchart of FIG. 7, where the (IED) response to the write command at step 702-e is—01 10 8106 002, which is included in a file returned by the IED.

In the present example, 10 requested bytes are returned by the IED in response to the command. It should be noted that in the case of a virtual FTP file command, no actual file is accessed in the IED. Instead, the path name C:\Modbus\ acts as a flag that notifies the IED that the FTP command is in actuality an FTP virtual command and that no actual file is being attempted to be accessed.

By way of another example, a virtual FTP command is created as a Modbus Command with an FTP interface to write 1 register at an IED at location 'E001'. The virtual FTP write command has the form of an FTP file read command to write to the register at 'E001':

FTP Virtual File Command: C:\Modbus\01\06\E001\0001\txt.

In accordance with this example, the Modbus command, "0106E0010001", which is included as part of the path name of the FTP Virtual File Command is interpreted in the IED as a Modbus command with a Device Address 01, Function Code 06 (which is a Write Register Command), Register Address E001, Data 0001. This exemplary FTP virtual file command is a request for the register at E001 to change it data value from low to high. In one embodiment, this register may be associated to a relay which when the data value in the register is high the relay is energized (or on) and when the data value is low, the relay is de-energized (or off).

In accordance with a further embodiment, the FTP virtual command may refer to an actual file in the IED, unlike the previous example. However, in the present case, the file that is being referenced is not a conventional IED file but is instead a virtual command file in the sense it contains commands (e.g., Modbus commands) which will be processed by the IED. The FTP virtual command file can exist in either non-volatile memory or in a virtual file.

It is to be appreciated that other forms and embodiments of the present disclosure are envisioned by the inventors. For instance, FTP interface could be used with a combination of a non-file centric protocol and FTP wherein the FTP portion is used for the file transfers and the non-file centric protocol is used for the command and other such information retrieval. It is also further envisioned that the FTP protocol itself can be configured to mimic a non-file centric protocol type protocol.

One such embodiment of the FTP protocol method would be to embed a non-file centric protocol type command in a small FTP file that would be read by a master system, e.g., a PC computer, from the IED. The Master system would then respond by replace or appending to the file with a request for different information of issue a command. The IED would then read the file and parse the command. This would allow the FTP solution to accomplish an embodiment of the present disclosure. There are more embodiments using different protocols and protocol embedding techniques that are that the inventor envisions.

Some additional non-limiting examples of virtual command files are described as follows.

Example 1

Resets: Logs, features, or the device itself could be reset when specific files are opened. Additional security could include writing a password to the file as verification.

For example, a virtual command having the form, C:\RESET_LOG1\txt

Notifies the firmware of the IED to recognize the command as a virtual command and directs the IED to execute the virtual command file, REST_LOG1, causing the LOG1 file or files in the IED to be reset (cleared).

Example 2

Virtual Readings: A virtual file which contains all of the readings from the IED, and only needs to be updated when that file is read.

For example, a virtual command having the form, C:\READINGS_VOLTAGES\txt

Notifies the firmware of the IED to recognize the command as a virtual command and directs the IED to execute the virtual command file READINGS_VOLTAGE, causing the IED to retrieve the current readings in the IED and send the readings as a file to a requesting device.

Example 3

Virtual communications: Communications protocols which have been implemented for other communications media (Modbus RTU via RS485, Modbus TCP, etc.) can be used via the Virtual Command Files. The implementation of the protocol via the Virtual Command Files could be, but is not limited to, embedding the fields of the protocol in the names of the files.

Example 4

Communications Buffer: A virtual file which acts as a virtual communication buffer, mimicking an actual COM port so that the data contained in the virtual command file is processed as if it was coming from a communication port. Reads and writes are processed the same way as with a COM port, and data is communicated using the same protocols (Modbus, etc.).

Example 5

Data Streams: a small file which acts as an incrementing window to a larger block of data. Each read of this file provides the next sequential block of data from the source block of data. The source of the data may be another file, a block of memory, or generated upon request.

Example 6

State Control: The internal processing state of IED can be modified as a result of specific file accesses. For example, access to specific files could signal the beginning and end of a log retrieval session. Another example would be pause or restart logging as a result of a specific file access. The file may or may not physically exist.

Example 7

Logging Access: When any file is accessed, a log of those actions can be kept for security and administrative purposes.

Example 8

Data Encryption: The data read from and written to a file can be modified such that it transparently provides encryption on the data stored on the device. This is useful for files on the compact flash, as the compact flash can be removed and accessed from any card reader. This can be further extended using File Redirection, as described below.

Example 9

Data Modification: The data read from and written to a file can be modified such that it is customized to the current state of the device, and to the requestor's current state. This includes providing individual responses to each FTP connection, perhaps in conjunction with a network diagnostic request.

Example 10

File Redirection: When a file is accessed, the file which is actually opened can be redirected to another file, or group of files (given a location in the file). This allows for long term obfuscation of the location and contents of files to unsecured users (i.e., Direct compact flash access, uncontrollable by the IED), while still remaining transparent to the security controlled user (access through FTP).

Data and File Compression

Data and File Transfer Compression:

In accordance with one aspect of the present disclosure, data transferred between an IED and an external client (computer) is compressed by the sender and decompressed by the receiver. This improves the overall data transfer rate between the two entities. Compression as defined herein is any algorithm f(A) which receives as input, a block of data (A), and outputs another block of data (B), where the size of the output data block (B) is smaller than the size of the input data block (A), and for which there is a corresponding decompression function f'(B), which inputs block (B), and outputs the original block (A).

Further, the protocol which transfers the block of data shall not be compressed. As one non-limiting example, only the data within a Modbus message is compressed but not the rest of the Modbus message such as the header, so as to provide compatibility on the transmission network or networks over which the data is transferred.

The sender may be either the client or the IED. Compression is supported in both directions. That is, where the IED is transmitting data to an external device or receiving data or files from an external device.

Four approaches are contemplated for compressing data sent from the IED to an external device.

First, it is contemplated to compress all data sent from the IED. Second, it is contemplated to compress certain subset of data or files being transferred from the IED. For example, the Log files, which are consistently downloaded from the IED. Third, via the addition of a command function, initiated by an external device, to inform the IED to compress a particular block of data or file. In accordance with this third approach, the sender (e.g., external PC) may instruct the IED to pre-compress the data before it is sent by the IED to the PC. In this case, the requested data may not necessarily be stored in compressed form in non-volatile storage beforehand, but is instead compressed in response to the request.

Advantages of using the third approach include, enhancing the performance and increase the efficiency of the processing and in many cases increasing the compression ratio so that the size of the transfer will be further reduced. Efficiency is realized by compressing large blocks of data at the source. Secondly, only data or files in which compressions gives a distinct advantage can be selectively compressed such as selecting only very large log files for compression versus compressing everything that is transmitted by the IED unconditionally or a fixed subset. An additional benefit is the simplification of the implementation by moving out the compression processing out of the communication processing path and making it an independent function, thereby creating two simpler functions (e.g., compression separate from communications) as opposed to a complex communication function that includes compression as one element in its processing.

A fourth approach is to compress the data or file being transferred on the fly. This minimizes the storage requirements required in the IED. The data or file being compressed and transferred on the fly would be individually selectable via the addition of a command function.

The receiver may store the data received in a compressed form, and later decompress the data as needed.

It is to be appreciated that the IED in accordance with the present disclosure employs conventional compression algorithms currently in use or that will be in use in the future such as lossless compression algorithms and lossy compression algorithms. Lossless compression algorithms do not change the content of a file, and therefore, if a file is compressed and then decompressed, the file or portion thereof has not changed. Exemplary lossless compression algorithms include CCITT group 3 & 4 compression, Flate/deflate compression, Huffman compression, LZW compression, and RLE compression. Lossy compression algorithms achieve better compression ratio's by selectively getting rid of some of the information in the file portion thereof. Exemplary lossy compression algorithms include JPEG compression, MP3 compression and MPEG compression, Data Transfer Encryption:

Data transferred between the meter and the client (computer) which is encrypted by the sender and decrypted by the receiver. This allows for the data transferred to be secure on an unsecure network.

The sender may be either the client or the IED. Encryption is supported in both directions. That is, where the IED is transmitting data to an external device or receiving data or files from an external device.

Four approaches are contemplated for encryption of data sent from the IED to an external device. However, the present disclosure is not limited to these or any other embodiments and that additional embodiments are contemplated to be within the scope of the invention.

First, it is contemplated to encrypt all data sent from the IED. Second, it is contemplated to encrypt certain subset of data or files being transferred from the IED. For example, the Log files in the IED, which are may be contain sensitive information. Third, via the addition of a command function, initiated by an external device, to inform the IED to encrypt a particular block of data or file. In accordance with this third approach, the sender (e.g., external PC) may instruct the IED to pre-encrypt the data before it is sent by the IED to the PC. Fourth, is the addition of a command function which initiates the transfer of data or files with encryption taking place as the transfer is being performed to minimize the internal storage requirements of the IED.

It is to be appreciated that the IED in accordance with the present disclosure employs conventional code encryption algorithms currently in use or that will be in use in the future such as symmetric encryption algorithms (also called secret key encryption) and asymmetric encryption algorithms (also called public key encryption).

Symmetric Encryption (also known as symmetric-key encryption, single-key encryption, one-key encryption and private key encryption) is a type of encryption where the same secret key is used to encrypt and decrypt information or there is a simple transform between the two keys. A secret key can be a number, a word, or just a string of random letters. Secret key is applied to the information to change the content in a particular way. This might be as simple as shifting each letter by a number of places in the alphabet. Symmetric algorithms require that both the sender and the receiver (e.g., the IED and PC, or vice versa) know the secret key, so they can encrypt and decrypt all information. There are two types of symmetric algorithms: Stream algorithms (Stream ciphers) and Block algorithms (Block ciphers). Stream ciphers encrypt the bits of information one at a time—operate on 1 bit (or sometimes 1 byte) of data at a time (encrypt data bit-by-bit). Stream ciphers are faster and smaller to implement than block ciphers, however, they have an important security gap. If the same key stream is used, certain types of attacks may cause the information to be revealed. Block cipher (method for encrypting data in blocks) is a symmetric cipher which encrypts information by breaking it down into blocks and encrypting data in each block. A block cipher encrypts data in fixed sized blocks (commonly of 64 bits). The most used block ciphers are Triple DES and AES. Some examples of symmetric encryption algorithms include: AES(Advanced Encryption Standard)/Rijndael, Blowfish, CAST5, DES (Data Encryption Standard), IDEA (International Data Encryption Algorithm), RC2, RC4, RC6, Serpent, Triple DES, and Twofish.

Asymmetric encryption uses different keys for encryption and decryption. The decryption key is very hard to derive from the encryption key. The encryption key is public so that anyone can encrypt a message. However, the decryption key is private, so that only the receiver is able to decrypt the message. It is common to set up "key-pairs" within a network so that each user and/or device has a public and private key. The public key is made available to everyone so that they can send messages, but the private key is only made available to the person and/or it belongs to. Generally, the sender and the recipient must have the same software. The recipient makes a pair of keys—public key and private key (both keys can be unlocked with a single password). Public key can be used by anyone and/or device with the same software to encrypt a message. Public keys can be freely distributed without worrying since it is only used to scramble (encrypt) the data. The sender does not need the recipient's password to use his or her public key to encrypt data. The recipient's other key is a private key that only he or she can use when decrypting the message. Private key should never be distributed since the private key assures that only the intended recipient can unscramble (decrypt) data intended for him or her. Some Asymmetric Algorithms (public key algorithms) such as RSA allow the process to work in the opposite direction as well: a message can be encrypted with a private key and decrypted with the corresponding public key. Some examples of popular asymmetric encryption algorithms: RSA, DSA (Digital Signature Algorithm), and PGP (Pretty Good Privacy).

It is further to be appreciated that the encryption may include a combination of symmetric encryption and asymmetric encryption, where a random symmetric key is created to encrypt the data, and then that key is asymmetrically encrypted. Once the key is asymmetrically encrypted, it is added to the encrypted message. The receiver gets the key, decrypts it with their private key, and uses it to decrypt the message.

Although the disclosure herein has been described with reference to particular illustrative embodiments, it is to be understood that these embodiments are merely illustrative of the principles and applications of the present disclosure. Therefore numerous modifications may be made to the illustrative embodiments and other arrangements may be devised without departing from the spirit and scope of the present disclosure, which is defined by the appended claims.

Furthermore, although the foregoing text sets forth a detailed description of numerous embodiments, it should be understood that the legal scope of the invention is defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

It should also be understood that, unless a term is expressly defined in this patent using the sentence "As used herein, the term '_____' is hereby defined to mean . . . " or a similar sentence, there is no intent to limit the meaning of that term, either expressly or by implication, beyond its plain or ordinary meaning, and such term should not be interpreted to be limited in scope based on any statement made in any section of this patent (other than the language of the claims). To the extent that any term recited in the claims at the end of this patent is referred to in this patent in a manner consistent with a single meaning, that is done for sake of clarity only so as to not confuse the reader, and it is not intended that such claim term be limited, by implication or otherwise, to that single meaning. Finally, unless a claim element is defined by reciting the word "means" and a function without the recital of any structure, it is not intended that the scope of any claim element be interpreted based on the application of 35 U.S.C. §112, sixth paragraph.

What is claimed is:

1. A method comprising the steps of:
coupling an intelligent electronic device (IED) to an electrical distribution system to enable the IED to sense power distributed to a load, the IED configured to operate under a non-file-centric protocol;
enabling the non-file-centric protocol of the IED to support one or more file-centric protocols;
receiving one or more file-centric commands at the IED from an external device, the one or more file-centric commands being supported in the one or more file-centric protocols; and
processing the one or more file-centric commands in the IED in accordance with the non-file-centric protocol, thereby extending the non-file-centric protocol to support the one or more file-centric protocols;
wherein the step of enabling the non-file-centric protocol to support the one or more file-centric protocols comprises the step of extending a non-file-centric command set of the non-file-centric protocol to include the one or more file-centric commands; and
wherein the step of extending the non-file-centric command set further comprises:
embedding the one or more file-centric commands of the one or more file-centric protocol as one or more parameters in the IED, wherein the one or more parameters are embedded in a path and file name of the one or more file-centric commands, wherein the one or more file-centric commands comprise at least one of a request to transfer one or more files stored in a file system of the IED from the IED to the external device, a request to obtain information pertaining to the one or more files stored in the file system of the IED, and a request to perform a file system operation on the one or more files stored in the file system of the IED; and
interpreting the one or more file-centric commands in the IED as a non-file-centric command to perform an operation by the IED.

2. The method of claim 1, wherein the one or more file-centric commands comprises at least one of a request to compress a block of data and a request to compress one or more files stored in a file system of the IED.

3. The method of claim 2, wherein the step of processing the one or more file-centric commands comprises at least one of compressing the block of data and compressing the one or more files stored in the file system of the IED.

4. The method of claim 3, wherein compressing the block of data and compressing the one or more files stored in the file system of the IED optimizes the transfer of data from the IED to the external device.

5. The method of claim 1, wherein the step of processing the one or more file-centric commands comprises at least one of transferring the one or more files from the IED to the external device, providing the information pertaining to the one or more files stored in the file system of the IED from the IED to the external device, and performing the file system operation on the one or more files stored in the file system of the IED.

6. The method of claim 1, wherein the file system operation comprises at least one of: (a) appending to a file, (b) creating a directory, (c) creating a file, (d) writing data to a file, (e) overwriting a file (f) user security status, (g) sending a username, (h) sending a password, (i) logging off, (j) changing a directory, (k) retrieving a current directory, (l) listing directory contents, (m) deleting a file/directory, (n) renaming a file/directory from, (o) renaming a file/directory to, (p) retrieving file details, (q) closing a file, (r) performing a firmware update, (s) retrieving firmware update status, and (t) retrieving firmware information.

7. The method of claim 1, wherein, in response to a request to transfer one or more files from the IED to the external device, the step of processing the one or more file-centric commands further comprises limiting a data transfer packet size to match a native packet data transfer size of a network transfer protocol to thereby optimize the transfer of the one or more files from the IED to the external device.

8. The method of claim 7, wherein the network transfer protocol is the Ethernet protocol.

9. The method of claim 1, wherein the one or more interpreted commands are encryption commands.

10. The method of claim 1, wherein the one or more interpreted commands are compression commands.

11. The method of claim 1, wherein the step of extending the non-file-centric command set further comprises:
embedding the one or more file-centric commands in a file to be transmitted from the external device to the IED;
parsing the file at the IED to extract the one or more embedded commands; and
executing the one or more extracted, embedded commands by the IED.

12. The method of claim 1, wherein the non-file-centric protocol is the Modbus protocol.

13. A system comprising:
an intelligent electronic device (IED) coupled to an electrical distribution system for sensing power distributed to a load, the IED comprising a network interface, a processor, and a file system, wherein the IED is configured to operate under a non-file-centric protocol;
an external device configured to operate under a file-centric protocol; and
a network enabling the external device to communicate with the IED via the network interface;

wherein the external device is configured to submit a file-centric command supported by the file-centric protocol to the IED;

wherein the processor of the IED is configured to receive the file-centric command and process the file-centric command according to the non-file-centric protocol to thereby extend the non-file-centric protocol to support the file-centric protocol in the IED;

wherein the processor of the IED extends a non-file-centric command set of the non-file-centric protocol to include one or more file-centric commands by embedding the one or more file-centric commands of the one or more file-centric protocol as one or more parameters in the IED, wherein the one or more parameters are embedded in a path and file name of the one or more file-centric commands, wherein the one or more file-centric commands comprise at least one of a request to transfer one or more files stored in a file system of the IED from the IED to the external device, a request to obtain information pertaining to the one or more files stored in the file system of the IED, and a request to perform a file system operation on the one or more files stored in the file system of the IED; and wherein the processor of the IED interprets the one or more file-centric commands in the IED as a non-file-centric command to perform an operation by the IED.

14. The system of claim 13, wherein the request to perform a file system operation comprises at least one of:
a request to perform a compression operation on the one or more files stored in the file system of the IED; and
a request to perform an encryption operation on the one or more files stored in the file system of the IED.

15. The system of claim 13, wherein the processor of the IED is configured to process the file-centric command to at least:
transfer the one or more files from the IED to the external device;
transfer the information pertaining to the one or more files stored in the file system of the IED; and
perform the file system operation on the one or more files stored in the file system of the IED.

16. The system of claim 13, wherein the file-centric command comprises a request to transfer one of a compressed block of data and a compressed file between the IED and the external device.

17. The system of claim 16, wherein, in response to receiving one of the compressed block of data and the compressed file, the processor is further configured to decompress one of the compressed block of data and the compressed file.

18. The system of claim 13, wherein the non-file-centric protocol is the Modbus protocol.

19. An intelligent electronic device (IED) coupled to an electrical distribution system for sensing power distributed to a load, comprising:

a network interface configured to enable communications with an external device via a network, the external device configured to operate under a file-centric protocol; and a processor including an associated file system, wherein the processor is configured to operate under a non-file-centric protocol;

wherein the processor is configured to receive a file-centric command supported by the file-centric protocol and process the file-centric command according to the non-file-centric protocol to thereby extend the non-file-centric protocol to support the file-centric protocol in the IED;

wherein the processor of the IED extends a non-file-centric command set of the non-file-centric protocol to include one or more file-centric commands by embedding the one or more file-centric commands of the one or more file-centric protocol as one or more parameters in the IED, wherein the one or more parameters are embedded in a path and file name of the one or more file-centric commands, wherein the one or more file-centric commands comprise at least one of a request to transfer one or more files stored in a file system of the IED from the IED to the external device, a request to obtain information pertaining to the one or more files stored in the file system of the IED, and a request to perform a file system operation on the one or more files stored in the file system of the IED; and wherein the processor interprets the one or more file-centric commands in the IED as a non-file-centric command to perform an operation by the IED.

20. The IED of claim 19, wherein the request to perform a file system operation comprises at least one of:
a request to perform a compression operation on the one or more files stored in the file system of the IED; and
a request to perform an encryption operation on the one or more files stored in the file system of the IED.

21. The IED of claim 19, wherein the processor is configured to process the file-centric command to at least:
transfer the one or more files from the IED to the external device;
transfer the information pertaining to the one or more files stored in the file system of the IED; and
perform the file system operation on the one or more files stored in the file system of the IED.

22. The IED of claim 19, wherein the file-centric command comprises a request to transfer one of a compressed block of data and a compressed file between the IED and the external device.

23. The IED of claim 22, wherein, in response to receiving one of the compressed block of data and the compressed file, the processor is further configured to decompress one of the compressed block of data and the compressed file.

24. The IED of claim 19, wherein the non-file-centric protocol is the Modbus protocol.

* * * * *